US009450005B2

(12) United States Patent
Yanagita et al.

(10) Patent No.: US 9,450,005 B2
(45) Date of Patent: Sep. 20, 2016

(54) IMAGE PICKUP DEVICE AND IMAGE PICKUP APPARATUS

(71) Applicant: SONY CORPORATION, Tokyo (JP)

(72) Inventors: Takeshi Yanagita, Tokyo (JP); Suguru Saito, Kumamoto (JP); Kaoru Koike, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/778,738

(22) PCT Filed: Mar. 27, 2014

(86) PCT No.: PCT/JP2014/059018
§ 371 (c)(1),
(2) Date: Sep. 21, 2015

(87) PCT Pub. No.: WO2014/157579
PCT Pub. Date: Oct. 2, 2014

(65) Prior Publication Data
US 2016/0049439 A1   Feb. 18, 2016

(30) Foreign Application Priority Data

Mar. 29, 2013 (JP) .................. 2013-073054
Mar. 12, 2014 (JP) .................. 2014-049049

(51) Int. Cl.
*H01L 27/142* (2014.01)
*H01L 27/144* (2006.01)
*H01L 27/146* (2006.01)

(52) U.S. Cl.
CPC ..... *H01L 27/14623* (2013.01); *H01L 27/1464* (2013.01); *H01L 27/14607* (2013.01); *H01L27/14621* (2013.01); *H01L 27/14627* (2013.01); *H01L 27/14636* (2013.01); *H01L 27/14645* (2013.01)

(58) Field of Classification Search
CPC .......... H01L 27/146; H01L 27/14607; H01L 27/14627; H01L 27/1464; H01L 27/14645; H01L 27/14621; H01L 27/14623
See application file for complete search history.

(56) References Cited

U.S. PATENT DOCUMENTS

| 2010/0201834 A1* | 8/2010 | Maruyama ......... H01L 27/1464 348/222.1 |
| 2012/0153127 A1* | 6/2012 | Hirigoyen ........ H01L 27/14609 250/208.1 |
| 2013/0182156 A1* | 7/2013 | Moriya .................. H04N 5/335 348/294 |

FOREIGN PATENT DOCUMENTS

| JP | 2007-53183 A | 3/2007 |
| JP | 2007-281296 | 10/2007 |

(Continued)

OTHER PUBLICATIONS

International Search Report prepared by the Japanese Patent Office on Apr. 30, 2014, for International Application No. PCT/JP2014/059018.

*Primary Examiner* — Jerome Jackson, Jr.
*Assistant Examiner* — Paul Budd
(74) *Attorney, Agent, or Firm* — Sheridan Ross P.C.

(57) ABSTRACT

An image pickup device according to the present disclosure includes a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, in which at least a part of a wall surface of the step part is covered with a first light shielding section.

43 Claims, 20 Drawing Sheets

(56) References Cited

FOREIGN PATENT DOCUMENTS

| | | |
|---|---|---|
| JP | 2008-60572 A | 3/2008 |
| JP | 2009-277885 A | 11/2009 |
| JP | 2011-029932 | 2/2011 |
| JP | 2012-084816 | 4/2012 |
| JP | 2012-137721 A | 7/2012 |
| JP | 2012-156212 A | 8/2012 |

* cited by examiner

IMAGE PICKUP DEVICE AND IMAGE PICKUP APPARATUS

CROSS REFERENCE TO RELATED APPLICATIONS

This application is a national stage application under 35 U.S.C. 371 and claims the benefit of PCT Application No. PCT/JP2014/059018 having an international filing date of Mar. 27, 2014, which designated the United States, which PCT application claimed the benefit of Japanese Patent Application No. 2013-073054 filed Mar. 29, 2013, and Japanese Patent Application No. 2014-049049 filed Mar. 12, 2014, the disclosures of which are incorporated herein by reference in their entirety.

TECHNICAL FIELD

The present technology relates to an image pickup device and an image pickup apparatus. More specifically, the present technology relates to an image pickup device having a focus detection function and to an image pickup apparatus including the image pickup device.

BACKGROUND ART

In recent years, a semiconductor imaging apparatus (an image pickup apparatus) including an image pickup device (a solid-state image pickup device) that has a focus detection function of phase difference detection system has been used. In the phase difference detection system, focus detection of pupil division system is used with use of two-dimensional sensor in which on-chip lens is provided in each pixel of the sensor.

In such an image pickup apparatus, technology meeting photodetection characteristics necessary for a pixel for image pick-up (an image pickup pixel) and a pixel for focus detection (an image plane phase difference pixel) has been developed. For example, in PTL 1, there is disclosed an image pickup apparatus in which an element isolation layer formed of a non-transparent conductive material is provided on a back surface of a silicon substrate on a light incident side to improve both of pupil division property and sensitivity.

Moreover, for example, in PTL 2, there is disclosed an image pickup apparatus in which a height of an on-chip lens is varied for each of an image pickup pixel and an focus detection pixel to adjust a light condensing position in each pixel.

Further, for example, in PTL 3, there is disclosed an image pickup apparatus in which a light waveguide is provided between a photoelectric conversion section and an on-chip lens of an image pickup pixel to meet photodetection characteristics necessary for the image pickup pixel and a focus detection pixel with the same lens shape.

CITATION LIST

Patent Literature

PTL 1: Japanese Unexamined Patent Application Publication No. 2012-84816
PTL 2: Japanese Unexamined Patent Application Publication No. 2007-281296
PTL 3: Japanese Unexamined Patent Application Publication No. 2011-29932

SUMMARY OF INVENTION

However, in a case where the shape of the on-chip lens is changed for each of the image pickup pixel and the focus detection pixel or in a case where an element isolation layer or a light waveguide is provided, cost and the number of manufacturing steps may be increased. Moreover, in a backside irradiation type image pickup apparatus detecting light by backside of a silicon substrate, in particular, a member on the photodetection side may be preferably formed with a small thickness (reduced in height) in order to suppress color mixing. In this case, however, the light condensing position of the incident light is located on the silicon substrate side. Therefore, sufficient autofocus characteristics (AF characteristics) in the focus detection pixel are not obtainable.

Therefore, it is desirable to provide an image pickup device and an image pickup apparatus that are adapted to achieve both of pixel characteristics of an image pickup pixel and AF characteristics of an image plane phase difference pixel with simple structure.

An image pickup device according to an embodiment of the technology includes a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section. At least a part of a wall surface of the step part is covered with a first light shielding section.

The light condensing section may include a lens as an optical functional layer, and the lens of the light condensing section of the first pixel may have a same shape as the lens of the light condensing section of the second pixel.

The lens of the light condensing section of the first pixel may be opposed to the photodetection section of the first pixel, and the lens of the light condensing section of the second pixel may be opposed to the photodetection section of the second pixel.

The wall surface of the step part may be perpendicular.

The second pixel may include a second light shielding section that shields a part of the photodetection surface, between the photodetection section and the light condensing section.

The first pixel and the second pixel may include a third light shielding section between the first pixel and the second pixel adjacent to each other.

The first light shielding section, the second light shielding section, and the third light shielding section may be formed of a same material.

The incident light of the first pixel may be condensed near the photodetection surface of the photodetection section.

The incident light of the second pixel may be condensed at a depth position same as a depth position of the second light shielding section.

The step part may be filled with an organic film.

The organic film may be formed of one of a polyimide resin, an acrylic resin, a styrene resin, and an epoxy resin.

The first pixel and the second pixel each may include a fixed charge film between the photodetection section and the light condensing section.

The first pixel and the second pixel may include a groove between the first pixel and the second pixel adjacent to each other, and the fixed charge film may be provided along wall surfaces and a bottom surface of the groove.

The groove may be filled with an insulating material.

The groove may be filled with an insulating material and one of the first light shielding section, the second light shielding section, and the third light shielding section.

A drive section including a wiring layer may be provided between the light condensing section and the photodetection section, and the wiring layer may also serve as the first light shielding section, the second light shielding section, and the third light shielding section.

The light condensing section may include a color filter of red, green, blue, or while, and the light condensing section of the second pixel may include a color filter of green or while.

An inner lens may be provided on the step part.

The inner lens may be an inner lens having an upward convex structure or a downward convex structure, or a rectangular inner lens.

An image pickup apparatus according to an embodiment of the technology includes an image pickup device. The image pickup device includes a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section. At least a part of a wall surface of the step part is covered with a first light shielding section.

The image pickup device according to the embodiment of the technology includes the first pixel and the second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, in which at least a part of a wall surface of the step part is covered with a first light shielding section.

In the image pickup apparatus according to the embodiment of the technology, the above-described image pickup device according to the embodiment of the technology is provided.

According to the embodiment of the technology, it is possible to condense the incident light at a position suitable for each of the image pickup pixel and the image plane phase difference pixel while reducing oblique incident light from an adjacent pixel. Further, it is possible to achieve both of the pixel characteristics of the image pickup pixel and the AF characteristics of the image plane phase difference pixel with simple structure.

Note that effects described here are non-limiting. Effects achieved by the technology may be one or more of effects described in the present disclosure.

DESCRIPTION OF EMBODIMENTS

Hereinafter, some embodiments of the disclosure will be described in detail with reference to drawings. Note that description will be given in the following order.

1. First embodiment (a backside irradiation type image sensor; an example in which a step part is provided between a first pixel and a second pixel, and a first light shielding section is provided on a side wall of the step part)
2. Modification 1 (an example in which a groove is provided between pixels and the groove is filled with an insulating material)
3. Modification 2 (an example in which a groove is provided between pixels and the groove is filled with an insulating material and a light shielding section)
4. Second embodiment (a surface irradiation type image sensor; an example in which a first light shielding section is formed of a wiring layer)
5. Third embodiment (a backside irradiation type image sensor; an example in which a step part is provided between a first pixel and a second pixel, a first light shielding section is provided on a side wall of the step part, and an inner lens is further provided)
6. Application examples (application examples of electronic apparatuses)

1. First Embodiment

Figure 1:
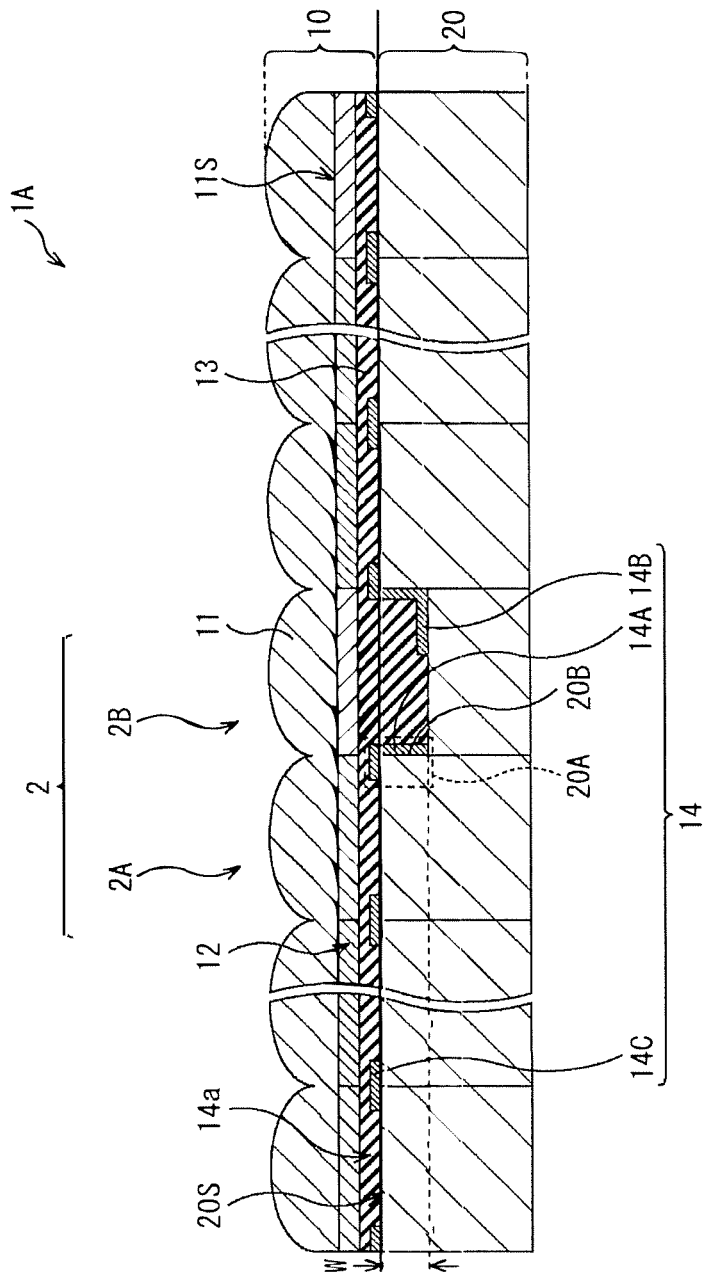
FIG. 1 is a sectional diagram illustrating an example of an image sensor according to a first embodiment of the disclosure.

FIG. 1 illustrates a sectional structure of an image sensor (an image sensor 1A) according to a first embodiment of the disclosure. The image sensor 1A may be, for example, a backside irradiation type (a back surface photodetection type) solid-state image pickup device (charge coupled device (CCD) image sensor, complementary metal-oxide semiconductor (CMOS)), and a plurality of pixels 2 are two-dimensionally arranged on a substrate 21 (see FIG. 3).

Figure 2:
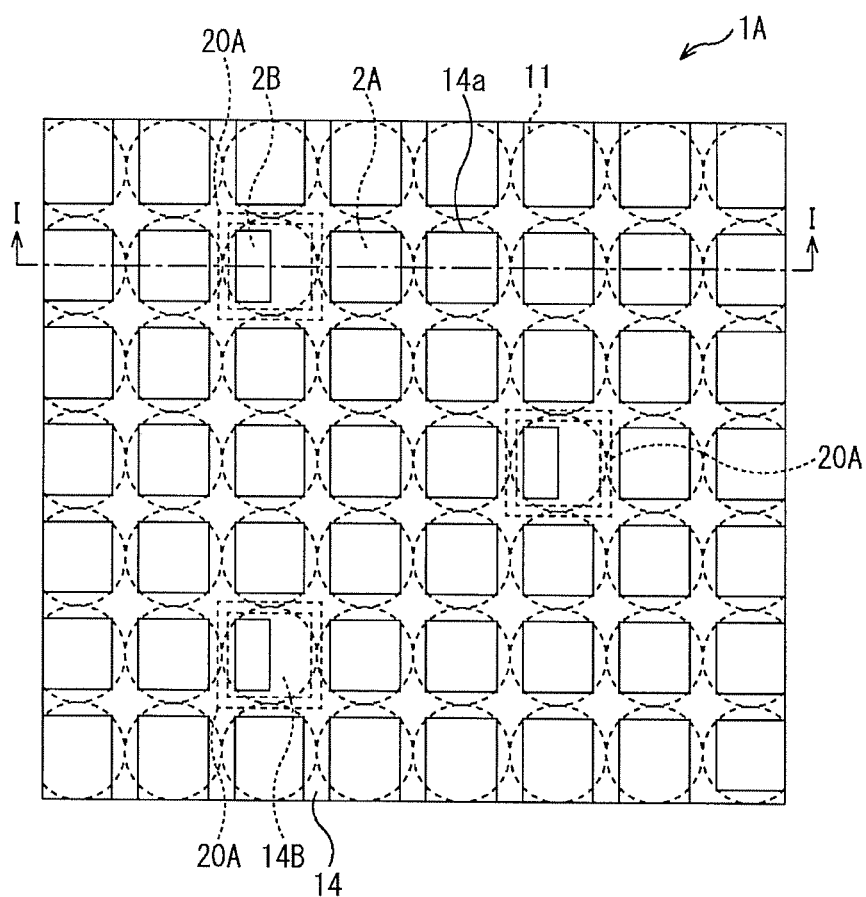
FIG. 2 is a plan view of the image sensor illustrated in FIG. 1.

Note that FIG. 1 illustrates a sectional structure of the image sensor along I-I line illustrated in FIG. 2. The pixels 2 includes image pickup pixels 2A (first pixels) and image plane phase difference pixels 2B (second pixels). In the present embodiment, a step part 20A is provided on photodetection surfaces 20S between the image pickup pixel 2A and the image plane phase difference pixel 2B that are adjacent to each other, and a side wall 20B of the step part 20A is covered with a light shielding film 14A (a first light shielding film).

Figure 3:
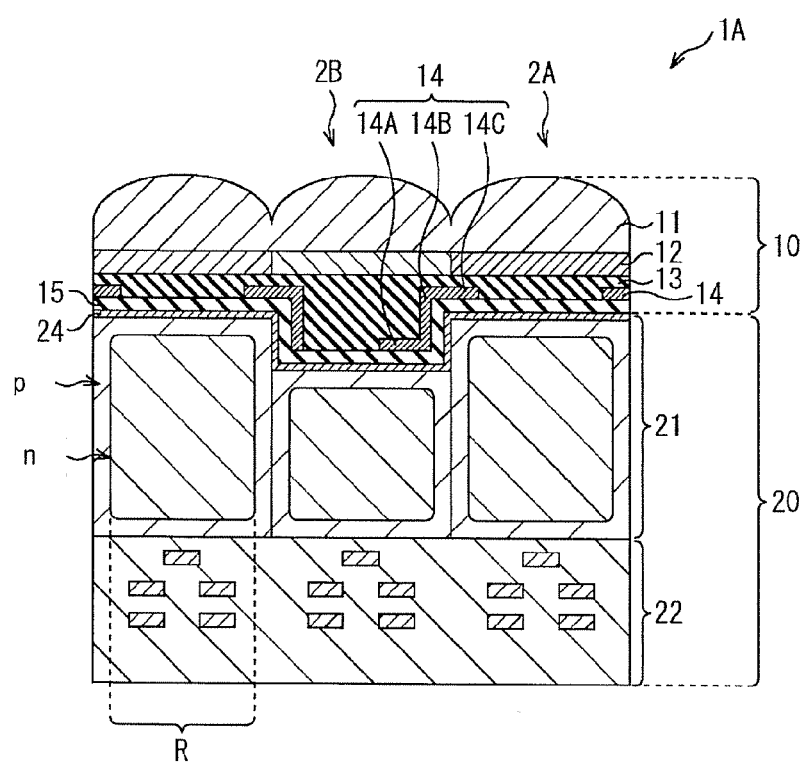
FIG. 3 is a sectional diagram illustrating a detailed structure of the image sensor illustrated in FIG. 1.

FIG. 3 illustrates a detailed sectional structure of the pixels 2 (the image pickup pixels 2A and the image plane phase difference pixels 2B). Each of the image pickup pixels 2A and the image plane phase difference pixels 2B includes a photodetection section 20 including a photoelectric conversion element (a photodiode 23) and a light condensing section 10 condensing incident light toward the photodetection section 20. Each of the image pickup pixels 2A photoelectrically converts an object image formed by an image pickup lens by the photodiode 23 to generate a signal for image generation.

Figure 4:
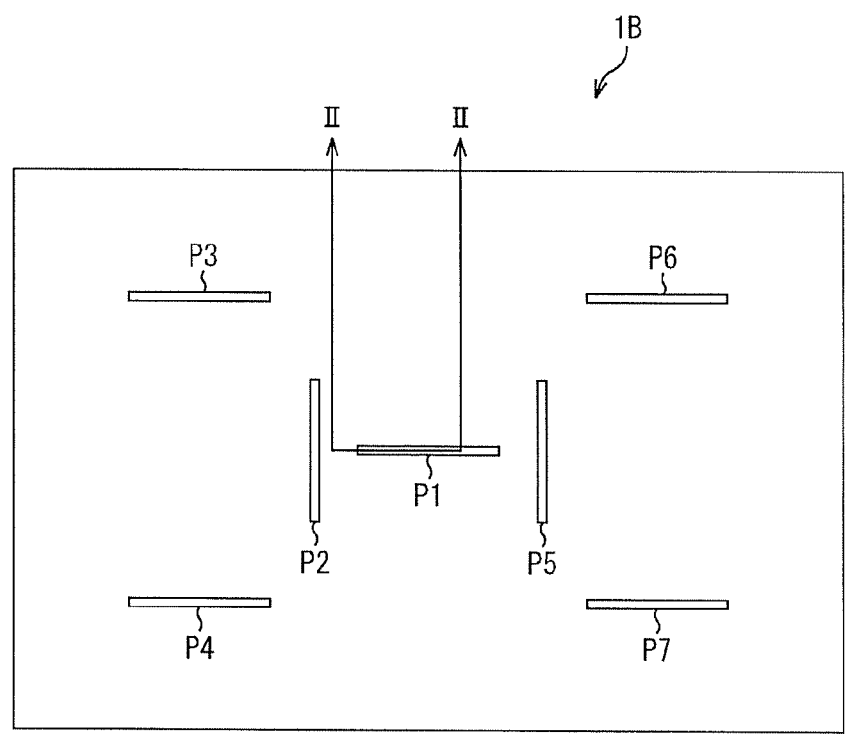
FIG. 4 is a plan view illustrating another arrangement structure of the image sensor according to the first embodiment of the disclosure.
Figure 5:
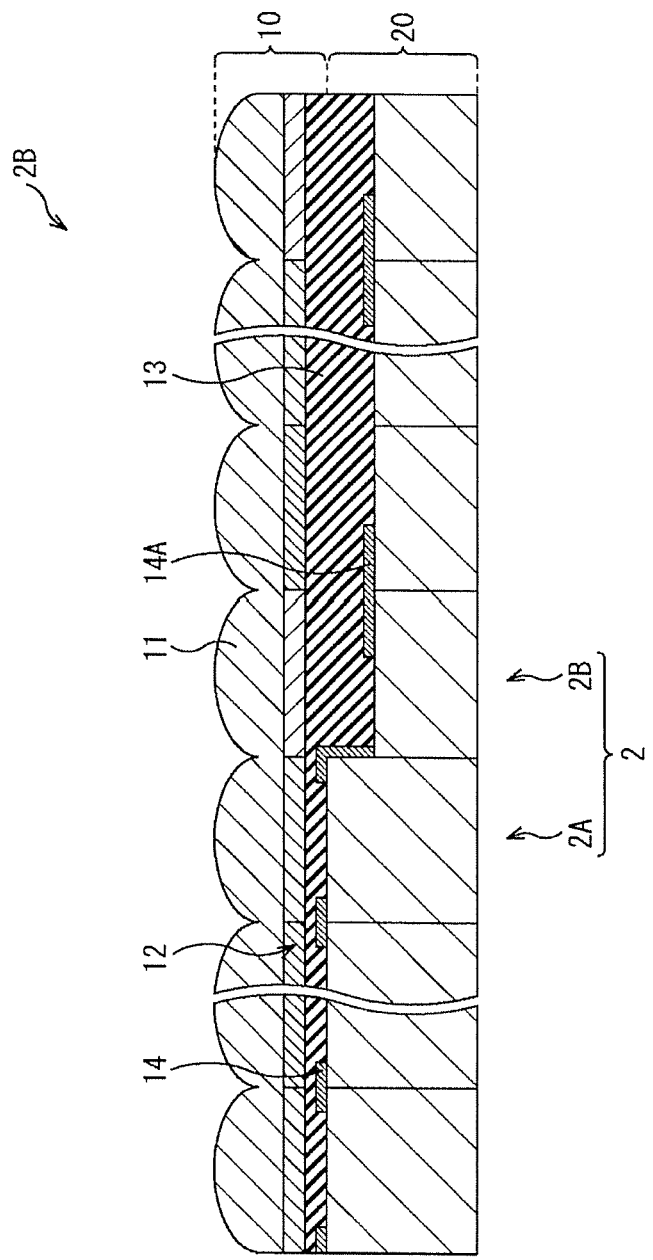
FIG. 5 is a sectional diagram of the image sensor illustrated in FIG. 4.

Each of the image plane phase difference pixels 2B divides a pupil region of an image pickup lens, and photoelectrically converts the object image from the divided pupil region to generate a signal for phase difference detection. The image plane phase difference pixels 2B are discretely disposed between the image pickup pixels 2A as illustrated in FIG. 2. Note that the image plane phase difference pixels 2B are not necessarily disposed independently as illustrated in FIG. 2, and for example, may be disposed in line as with P1 to P7 in a pixel section 200 as illustrated in FIG. 4. FIG. 5 illustrates a sectional structure of the image sensor 1B in which a plurality of image plane phase difference pixels 2B are arranged in line, taken along II-II line illustrated in FIG. 4.

As described above, in the present embodiment, the step part 20A is provided on the photodetection surface 20S of the photodetection section 20 between the image pickup pixel 2A and the image plane phase difference pixel 2B that are disposed adjacently to each other. In other words, the photodetection surface 20S of the image plane phase difference pixel 2B is formed at a position lower by one level than the position of the image pickup pixel 2A, with respect to an emission surface 11S of an on-chip lens 11. A height h of the step part 20A may be preferably, for example, 0.05 μm or larger and 2 μm or lower, and more preferably 0.3 μm or larger and 1 μm or lower, depending on curvature etc. of the on-chip lens 11.

The side wall 20B of the step part 20A is covered with a light shielding film 14 (the light shielding film 14A) in order to prevent crosstalk of oblique incident light between the image pickup pixel 2A and the image plane phase difference pixel 2B that are adjacent to each other. Note that the light shielding film 14A may be preferably provided over the entire surface of the side wall 20B of the step part 20A; however, the light shielding film 14A may cover at least a part of the side wall 20B to reduce the crosstalk of oblique incident light.

(Light Condensing Section 10)

The light condensing section 10 is provided on the photodetection surface 20S of the photodetection section 20, and has the on-chip lens 11 that is disposed oppositely to each pixel 2, on the light incident side as an optical functional layer. In the light condensing section 10, a color filter 12, a planarizing film 13, and the light shielding film 14 are provided between the on-chip lens 11 and the photodetection section 20 in order from the on-chip lens 11. In addition, an insulating film 15 is provided on the photodetection section 20 side of the planarizing film 13 and the light shielding film 14.

The on-chip lens 11 has a function of condensing light toward the photodetection section 20 (specifically, the photodiode 23 of the photodetection section 20). A lens diameter of the on-chip lens 11 is set to a value corresponding to the size of the pixel 2, and for example, may be 0.9 μm or larger and 3 μm or lower. Moreover, a refractive index of the on-chip lens 11 may be, for example, 1.1 to 1.8. The lens may be formed using, for example, an organic resin material.

In the present embodiment, the on-chip lens 11 provided on the image pickup pixel 2A has the same shape as the on-chip lens 11 provided on the image plane phase difference pixel 2B. Here, the same means that the on-chip lens 11 is manufactured using the same material through the same steps, which does not eliminate variation caused by various conditions in manufacturing.

The color filter 12 may be, for example, any of a red (R) filter, a green (G) filter, a blue (B) filter, and a white (W) filter, and may be provided, for example, for each pixel 2. These color filters 12 are provided in a regular color arrangement (for example, Bayer arrangement). Providing such color filters 12 makes it possible to obtain photodetection data of colors corresponding to the color arrangement in the image sensor 1.

Note that the color arrangement of the color filters 12 in the image plane phase difference pixel 2B is not particularly limited; however, the green (G) filter or the white (W) filter may be preferably used in order to use autofocus (AF) function even in a dark place with a small quantity of light. Incidentally, in a case where the green (G) filter or the white (W) filter is assigned to the image plane phase difference pixel 2B, the photodiode 23 of the image plane phase difference pixel 2B is easily saturated in a bright place with a large quantity of light. In this case, an overflow barrier of the photodetection section 20 may be closed.

The planarizing film 13 is charged in a recess formed by the step part 20A and planarizes the photodetection surface 20S of the photodetection section 20. As the material of the planarizing film 13, an inorganic material and an organic material may be used. Examples of the inorganic material may include an insulating film material, specifically, a silicon oxide film ($SiO_2$), a silicon nitride film (SiN), and a silicon oxynitride film (SiON).

Examples of the organic material may include a polyimide resin, an acrylic resin, a styrene resin, and an epoxy resin. The planarizing film 13 is formed of a single layer film or a stacked-layer film formed of any of the material described above. A thickness of the planarizing film 13 (a film thickness of the planarizing film 13 in the image pickup pixel 2A) may be preferably, for example, 50 μm or larger and 500 μm. Note that the organic film made of the organic material has high adhesiveness. Therefore, when the planarizing film 13 has a stacked-layer structure of the inorganic film and the organic film, it is possible to suppress occurrence of peeling of the color filter 12 and the on-chip lens 11 by providing the organic film on the color filter 12 side.

The light shielding film 14 includes a light shielding film 14B (a second light shielding film) for pupil division in the image plane phase difference pixel 2B and a light shielding film 14C (a third light shielding film) provided between the pixels adjacent to each other, in addition to the light shielding film 14A covering the side wall 20B of the step part 20A as described above.

The light shielding film 14 (in particular, the light shielding films 14A and 14C) suppresses color mixing caused by crosstalk of oblique incident light between the pixels adjacent to each other, and is provided in a lattice shape surrounding each pixel 2 as illustrated in FIG. 2. In other words, the light shielding film 14 has a structure in which an opening 14a is provided on an optical path of the on-chip lens 11.

Note that the opening 14a of the image plane phase difference pixel 2B is provided at a position (an eccentric position) close to one side of a photodetection region R of the pixel 2 described later. The light shielding film 14 may be formed of, for example, tungsten (W), aluminum (Al), or an alloy of Al and copper (Cu), and may have a thickness of, for example, 100 nm or larger and 800 nm.

Note that the light shielding film 14 may be formed by, for example, sputtering. The light shielding film 14C provided between the image pickup pixel 2A and the image plane phase difference pixel 2B that are adjacent to each other, the light shielding film 14A provided on the side wall 20B of the step part 20A, and the light shielding film 14B for pupil division may be continuously formed of the same material at the same step.

The insulating film 15 prevents damage of the Si substrate 21 in processing of the light shielding film 14, and is provided along the shape of the photodetection section 20. Examples of the material of the insulating film 15 may include a silicon oxide film ($SiO_2$), a silicon nitride film (SiN), and a silicon oxynitride film (SiON). A thickness of the insulating film 15 may be, for example, 10 nm or larger and 1000 nm or lower.

(Photodetection Section 20)

The photodetection section 20 includes a wiring layer 22, the photodiode 23, and a fixed charge film 24. The wiring layer 22 is provided on a front surface (on a side opposite to the photodetection surface 20S) of the silicon (Si) substrate 21 and includes transistors and metal wirings, the photodiode 23 is buried in the Si substrate 21, and the fixed charge film 24 provided on the back surface (on the photodetection surface side) of the Si substrate 21. A p-type impurity may be formed on a back interface of the Si substrate 21 by ion injection and pinning may be performed. Alternatively, a negative fixed charge film 24 may be formed to form an inversion layer (not illustrated) near the back surface of the Si substrate 21.

The photodiode 23 may be a pn-junction type photodiode that may be formed of, for example, an n-type semiconductor region formed in a thickness direction of the Si substrate 21 and a p-type semiconductor region provided near the front surface and the back surface of the Si substrate 21. In the present embodiment, the n-type semiconductor region configuring the photodiode 23 is referred to as the photoelectric conversion region R.

Note that the p-type semiconductor region facing the front surface and the back surface of the Si substrate 21 serves also as a hole charge accumulation region for suppressing dark current. In addition, the Si substrate 21 also has the p-type semiconductor region between the pixels 2, and the pixels 2 are separated from one another by the p-type semiconductor region.

Incidentally, when a green (G) filter or a white (W) filter is used as the color filter 12 of the image plane phase difference pixel 2B, the photodiode 23 is easily saturated. In this case, impurity concentration (here, concentration of p-type impurity) of overflow pass may be increased to close potential barrier so that the saturation is increased.

The fixed charge film 24 is provided between the light condensing section 10 (specifically, the insulating film 15) and the Si substrate 21 to fix the charge on the interface between the light condensing section 10 and the photodetection section 20. As the material of the fixed charge film 24, a high refractive index material having negative charge may be used, and examples thereof may include hafnium oxide ($HfO_2$), aluminum oxide ($Al_2O_3$), zirconium oxide ($ZrO_2$) film, tantalum oxide ($Ta_2O_5$), and titanium oxide ($TiO_2$).

Examples of the method of forming the fixed charge film 24 may include chemical vapor deposition method (hereinafter, referred to as CVD method), sputtering method, and atomic layer deposition method (hereinafter, referred to as ALD method). The interface state is reduced by the ALD method during film formation.

It is possible to form the $SiO_2$ film to have a thickness of about 1 nm at a time. Examples of the material other than those described above may include lanthanum oxide ($La_2O_3$), praseodymium oxide ($Pr_2O_3$), cerium oxide ($CeO_2$), neodymium oxide ($Nd_2O_3$), and promethium oxide ($Pm_2O_3$). Further, examples of the above-described material may include samarium oxide ($Sm_2O_3$), europium oxide ($Eu_2O_3$), gadolinium oxide ($Gd_2O_3$), terbium oxide ($Tb_2O_3$), and dysprosium oxide ($Dy_2O_3$).

In addition, holmium oxide ($Ho_2O_3$), thulium oxide ($Tm_2O_3$), ytterbium oxide ($Yb_2O_3$), lutetium oxide ($Lu_2O_3$), and yttrium oxide ($Y_2O_3$) may be used. Note that the film having the negative fixed charge (the fixed charge film 24) in the present embodiment may be formed of a hafnium nitride film, an aluminum nitride film, hafnium oxynitride film, or an aluminum oxynitride film. The film thickness thereof may be, for example, 4 nm or larger and 100 nm or lower.

Figure 6:
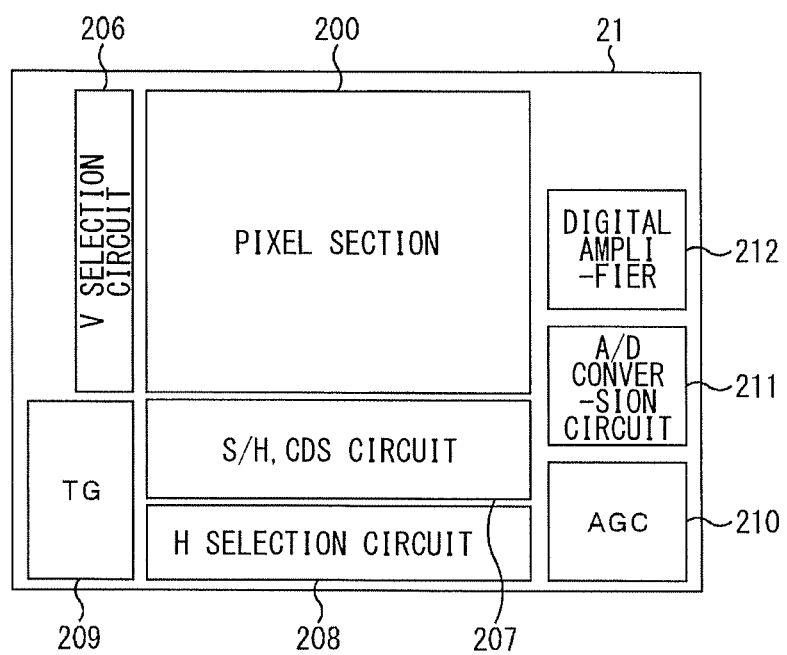
FIG. 6 is a block diagram illustrating a peripheral circuit configuration of a photodetection section illustrated in FIG. 1.

FIG. 6 is a functional block diagram illustrating a configuration of peripheral circuits of the pixel section 200 of the photodetection section 20. The photodetection section 20 includes a vertical (V) selection circuit 206, the sample/hold (S/H)-correlated double sampling (CDS) circuit 207, a horizontal (H) selection circuit 208, a timing generator (TG) 209, an automatic gain control (AGC) circuit 210, an A/D conversion circuit 211, and a digital amplifier 212, and these are mounted on the same Si substrate (chip) 21.

Such an image sensor 1A (and 1B) may be manufactured in the following manner.

(Manufacturing Method)

First, for example, a conductive impurity semiconductor layer may be provided by ion injection to the Si substrate 21, and the photodiode 23 is formed. Subsequently, after the multilayer wiring layer 22 is formed on the front surface of the Si substrate 21, the Si substrate 21 is polished to form the photodetection surface 20S. Then, the step part 20A may be formed at a predetermined position in the region (the pixel section 200) where the pixel 2 is to be formed on the back surface (the photodetection surface 20S) of the Si substrate 21, with use of, for example, dry etching. Here, the side wall 20B of the step part 20A is formed perpendicular to the plane direction of the Si substrate 21; however, the side wall 20B is not necessarily perpendicular to the plane direction of the Si substrate 21. Alternatively, for example, the side wall 20B of the step part 20A may be inclined as with the case where the step part 20A is formed with use of wet etching.

Next, the wiring layer 22 having the multilayer wiring structure is formed on a surface (the front surface) on a side opposite to the photodetection surface 20S of the Si substrate 21. Subsequently, the $HfO_2$ film may be formed to have a thickness of, for example, 60 nm on the back surface of the Si substrate 21 by, for example, sputtering method to form the fixed charge film 24.

Subsequently, for example, the insulating film 15 by the CVD method and the light shielding film 14 by the sputtering method may be formed in order on the fixed charge film 24. Next, the recess of the step part 20A is filled with the planarizing film 13 and the photodetection section 20 is planarized by the planarizing film 13, and then for example, the color filter 12 in Bayer arrangement and the on-chip lens 11 are formed in order. In this way, the image sensor 1A is manufactured.

(Action and Effects)

In the image sensor 1A (or 1B) of the backside irradiation type in the present embodiment, the thickness of the stacked-layer film (for example, the color filter 12 and the planarizing film 13) on the light incident side (the light condensing section 10) may be preferably reduced in order to suppress occurrence of color mixing between the pixels adjacent to each other. In addition, the highest pixel characteristics are obtainable by adjusting a focal point of the incident light on the photodiode 23 in the image pickup pixel 2A, whereas the highest AF characteristics are obtainable by adjusting the focal point of the incident light on the light shielding film 14B for pupil division in the image plane phase difference pixel 2B.

Figure 7A:
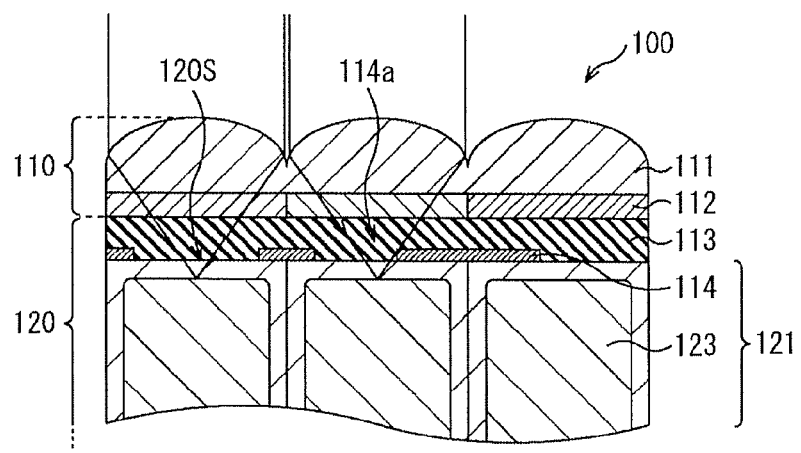
FIG. 7A is a sectional schematic diagram illustrating an image sensor and incident light as a comparative example.

FIG. 7A schematically illustrates a sectional surface structure of an image sensor 100 as a comparative example of the disclosure and incident light entering a pixel 102 configuring the image sensor 100. In the image sensor 100, a stacked-layer film (a color filter 112 and a planarizing film 113) of a light condensing section 110 is reduced in height, each of the pixels 102 has an on-chip lens 111 of the same shape, and a photodetection surface 120S of an image pickup pixel 102A and a photodetection surface 120S of an image plane phase difference pixel 102B are provided on the same plane.

Figure 7B:
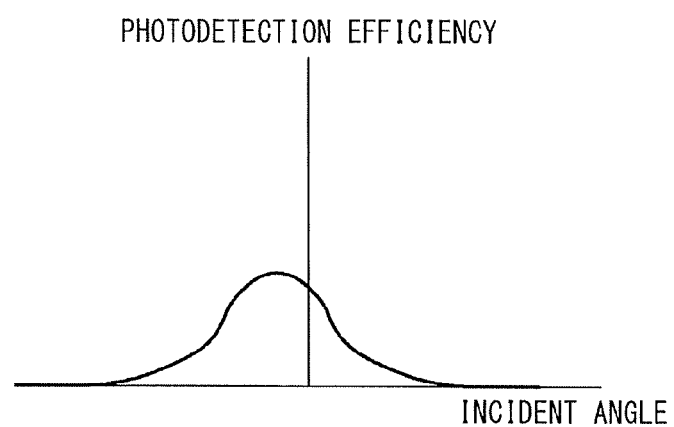
FIG. 7B is a characteristic diagram illustrating relationship between an incident angle and photodetection efficiency in the image sensor illustrated in FIG. 7A.

In such an image sensor 100, the position where the light emitted from the on-chip lens 111 is condensed is located in deeper position close to an Si substrate 121. Therefore, in the image pickup pixel 102A having a wide opening 114a by a light shielding film 114, luminous fluxes of substantially all of the incident light that have passed through the on-chip lens 111 are applied to a photodiode 123. In contrast, in the image plane phase difference pixel 102B having an eccentric opening 114a by pupil division, a part of the luminous fluxes is shielded by the light shielding film 114 and is not applied to the photodiode 123. FIG. 7B illustrates incident angle characteristics in the image plane phase difference pixel 102B.

Figure 8A:
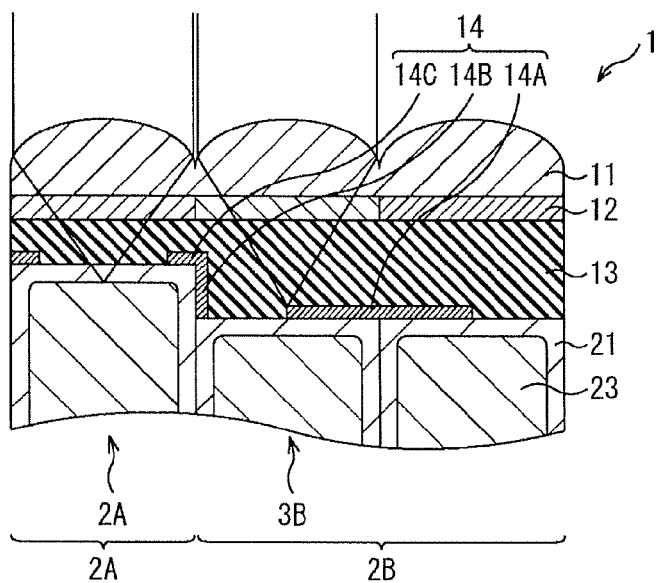
FIG. 8A is a sectional schematic diagram illustrating the image sensor illustrated in FIG. 1 and incident light.

FIG. 8A schematically illustrates the sectional structure of the image sensor 1B of the present embodiment and the incident light entering each of the pixels 2A and 2B. In the image sensor 1A, as described above, the step part 20A is provided between the image pickup pixel 2A and the image plane phase difference pixel 2B that are adjacent to each other, and the photodetection surface 20S of the image plane phase difference pixel 2B is provided at a position lower by one level than the photodetection surface 20S of the image pickup pixel 2A.

Figure 8B:
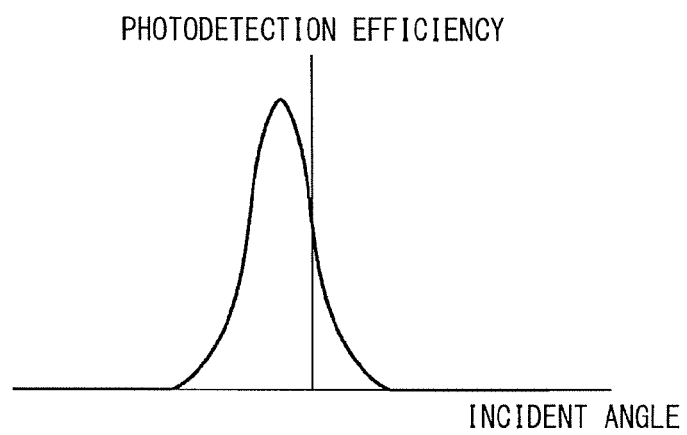
FIG. 8B is a characteristic diagram illustrating relationship between an incident angle and photodetection efficiency in the image sensor illustrated in FIG. 8A.

Specifically, design is made in such a manner that the incident light in the image pickup pixel 2A is condensed near the photodetection surface 20S and the incident light in the image plane phase difference pixel 2B is condensed at the same depth position as that of the light shielding film 14B for pupil division. Accordingly, similar to the image pickup pixel 2A, the luminous fluxes of substantially all of the incident light that have passed through the on-chip lens 11 are applied to the photodiode 23 also in the image plane phase difference pixel 2B. FIG. 8B illustrates incident angle characteristics in the image plane phase difference pixel 2B.

In the incident angle characteristic diagrams illustrated in FIG. 7B and FIG. 8B, a horizontal axis indicates an incident angle, and a vertical axis indicates photodetection efficiency. Comparing the characteristic diagram in FIG. 7A with the characteristic diagram in FIG. 8B, the photodetection efficiency of the image plane phase difference pixel 2B in which the photodetection surface 20S is provided at the position deeper than that of the image pickup pixel 2A is higher than the photodetection efficiency of the image pickup pixel 2A, namely, the characteristics of pupil intensity distribution of the image plane phase difference pixel 2B are sharper than those of the image pickup pixel 2A. In other words, it is possible for the image plane phase difference pixel 2B of the image sensor 1 in the present embodiment to generate the signal for phase difference detection with accuracy higher than that of the image plane phase difference pixel 102B of the image sensor 100 in the comparative example, in phase difference detection.

Moreover, in the present embodiment, providing the light shielding film 14A on the side wall 20B of the step part 20A suppresses color mixing caused by crosstalk of the oblique incident light between the pixels adjacent to each other.

As described above, in the present embodiment, each of the image pickup pixel 2A and the image plan phase difference pixel 2B has the light condensing section 10 and the photodetection section 20, the step part 20A is provided on the photodetection section 20 between the image pickup pixel 2A and the image plane phase difference pixel 2B that are adjacent to each other, and the side wall 20B of the step part 20A is covered with the light shielding film 14A. Accordingly, it is possible to condense the incident light that have passed through the on-chip lens 11 opposed to the photodetection section 20 of each pixel 2 at the depth position suitable for each of the image pickup pixel 2A and the image plane phase difference pixel 2B while suppressing crosstalk caused by the oblique incident light between the pixels 2 adjacent to each other. As a result, it is possible to improve the AF characteristics of the image plane phase difference pixel 2B while maintaining the pixel characteristics of the image pickup pixel 2A. In other words, it becomes possible to provide the image pickup unit in which the characteristics of both of the image pickup pixel 2A and the image plane phase difference pixel 2B are achieved with the simple structure.

Hereinafter, modifications (modifications 1 and 2) of the above-described first embodiment and a second embodiment are described. Like numerals are used to designate substantially like components of the above-described first embodiment, and the description thereof is appropriately omitted.

2. Modification 1

Figure 9:
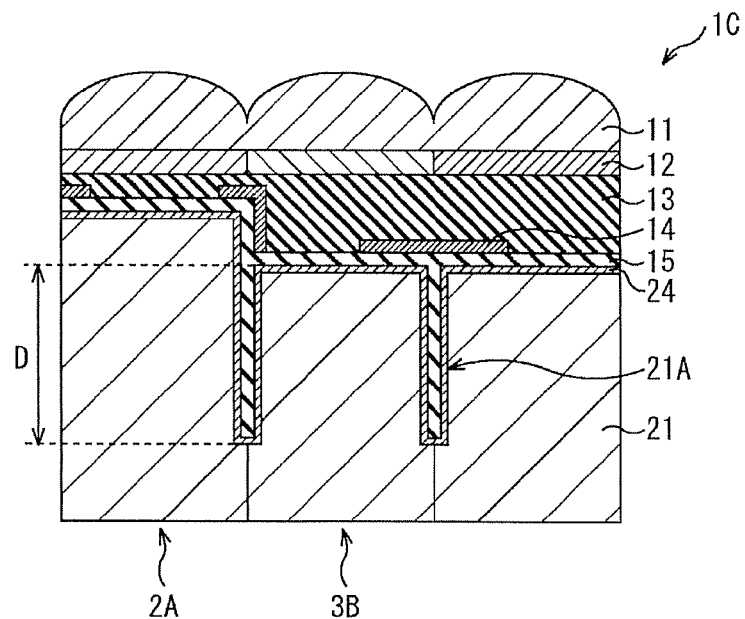
FIG. 9 is a sectional diagram of an image sensor according to a modification 1.

FIG. 9 illustrates a sectional structure of an image sensor (an image sensor 1C) according to the modification 1. Similarly to the image sensor 1A (and 1B) of the above-described first embodiment, the image sensor 1C is a backside irradiation type solid-state image pickup device, and has a structure in which a plurality of pixels 2 are two-dimensionally arranged.

The pixels 2 includes the image pickup pixels 2A and the image plane phase difference pixels 2B, and the step part 20A is provided on the photodetection surface 20S of the photodetection section 20 between the image pickup pixel 2A and the image plane phase difference pixel 2B that are adjacent to each other, similarly to the above-described embodiment. Incidentally, the image sensor 1C according to the present modification is different from the first embodiment in that a groove 21A is provided between the pixels 2 adjacent to each other on the photodetection surface 20S side of the photodetection section 20, irrespective of the image pickup pixel 2A and the image plane phase difference pixel 2B.

The groove 21A provided in the photodetection section 20 of the present modification separates the pixels 2 on the photodetection surface 20S side. The groove 21A is provided in the Si substrate 21 of the photodetection section 20, and a depth (D) of the groove 21 A provided between the image plane phase difference pixels 2B adjacent to each other may be, for example, 0.1 µm or larger and 5 µm or lower. The fixed charge film 24 formed continuously from the surface of the Si substrate 21 is provided on wall surfaces and a bottom surface of the groove 21A. In addition, the groove 21A covered with the fixed charge film 24 is filled with the insulating film 15.

In this way, in the present modification, the groove 21A is provided between the pixels 2, and the groove 21A is filled with the fixed charge film 24 and the insulating material forming the insulating film 15. Therefore, it is possible to further reduce color mixing caused by crosstalk of the oblique incident light between the pixels adjacent to each other. Also, an effect of preventing overflow of charge to the photodiode 23 of the adjacent pixel caused by saturation is exhibited.

3. Modification 2

Figure 10:
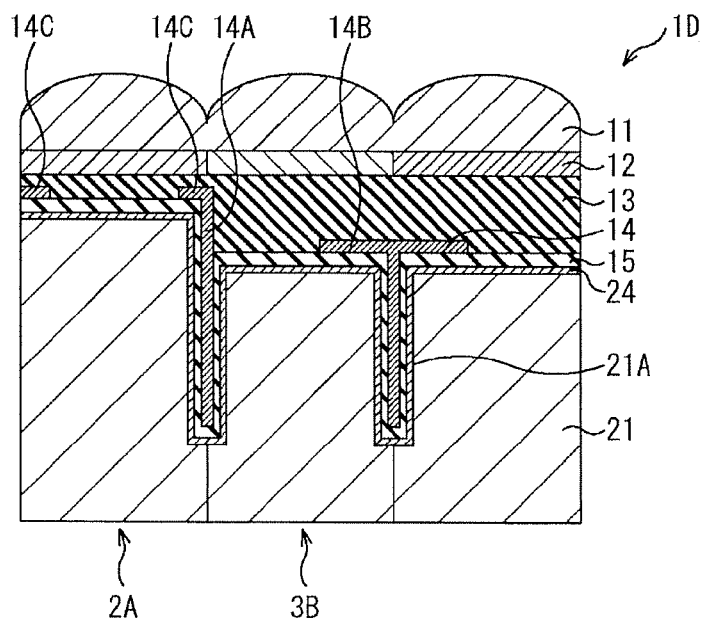
FIG. 10 is a sectional diagram of an image sensor according to a modification 2.

FIG. 10 illustrates a sectional structure of an image sensor (an image sensor 1D) according to the modification 2. Similar to the above-described image sensors 1A to 1C, the image sensor 1D is a backside irradiation type solid-state image pickup device, and has a structure in which a plurality of pixels 2 are two-dimensionally arranged. The image sensor 1D in the present modification has the groove 21A between the pixels 2 adjacent to each other on the photodetection surface 20S side of the photodetection section 20, irrespective of the image pickup pixel 2A and the image plane phase difference pixel 2B, similarly to the image sensor 1C of the modification 1. However, the image sensor 1D is different from the image sensor of the modification 1 in that the groove 21A is filled with the light shielding film 14 in addition to the fixed charge film 24 and the insulating film 15.

Specifically, in the groove 21A of the present modification, the fixed charge film 24 and the insulating film 15 provided on the Si substrate 21 are continuously provided along the wall surfaces and the bottom surface of the groove 21A. The groove 21A covered with the fixed charge film 24 and the insulating film 15 is filled with the light shielding film 14 provided between the pixels 2 (specifically, the light shielding film 14C between the image pickup pixels (2A and 2A) adjacent to each other, the light shielding film 14A between the image pickup pixel and the image plane phase difference pixel (2A and SB), and the light shielding film 14B between the image plane phase difference pixels (2B and 2B)).

In this way, in the present modification, the groove 21A provided between the pixels 2 is filled with the light shielding film 14 in addition to the fixed charge film 24 and the insulating film 15. Accordingly, it is possible to further reduce crosstalk of the oblique incident light between the pixels adjacent to each other, as compared with the above-described modification 1.

4. Second Embodiment

Figure 11:
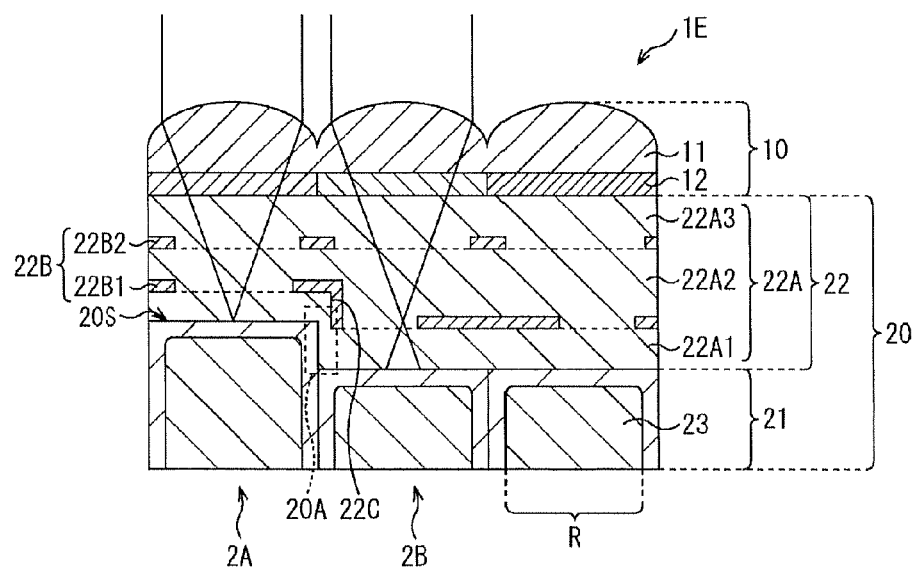
FIG. 11 is a sectional diagram illustrating an example of an image sensor according to a second embodiment of the disclosure.

FIG. 11 illustrates an example of a sectional structure of an image sensor (an image sensor 1E) according to the second embodiment of the disclosure. The image sensor 1E may be, for example, a surface irradiation type (a front surface photodetection type) solid-state image pickup device, and has a plurality of pixels 2 two-dimensionally arranged.

The pixels 2 include the image pickup pixels 2A and the image plane phase difference pixels 2B, and the step part 20A is provided on the photodetection surface 20S between the image pickup pixel 2A and the image plane phase difference pixel 2B adjacent to each other, similarly to the first embodiment and the modifications 1 and 2 described above. Incidentally, since the image sensor 1E of the present embodiment is of the surface irradiation type, the wiring layer 22 is provided between the light condensing section 10 and the Si substrate 21 configuring the photodetection section 20, and a metallic film 22B configuring the wiring layer 22 also serves as the light shielding film 14 in the first embodiment and the like.

In the present embodiment, as described above, the wiring layer 22 that is provided on a surface opposite to the surface provided with the light condensing section 10 of the Si substrate 21 in the first embodiment is provided between the light condensing section 10 and the Si substrate 21, and the metallic film 22B configuring the wiring layer 22 is used as the light shielding film 14.

Therefore, the light shielding film 14 and the insulating film 15 described in the first embodiment and the like are omitted, and the light condensing section 10 in the present embodiment is configured of the on-chip lens 11 and the color filter 12. Further, the fixed charge film 24 is also omitted. Similarly to the image sensor 1A and the like, the step part 20A formed on the photodetection section 20 is provided on the light condensing section 10 side of the Si substrate 21 having the photodiode 23, and a front surface of the Si substrate 21 provided with the step part 20A serves as the photodetection surface 20S.

The wiring layer 22 is provided between the light condensing section 10 and the Si substrate 21, and has a multilayer wiring structure in which, for example, the metallic film 22B is configured of two layers ($22B_1$ and $22B_2$, in FIG. 11) or three or more layers ($22B_1$, $22B_2$, $22B_3$, . . . ) with an interlayer insulating film 22A in between. The metallic film 22B is a metallic wiring for the transistors and the peripheral circuits. In the typical surface irradiation type image sensor, the metallic film 22B is provided between the pixels so as to secure an aperture ratio of the pixels and so as not to shield luminous flux emitted from an optical functional layer of the on-chip lens or the like. In the present embodiment, the metallic film 22B1 provided at a position closest to the Si substrate 21 of the multilayer wiring (the metallic film 22) is used as the light shielding film 14.

The interlayer insulating film 22A is provided between the metallic film $22B_1$ and the metallic film $22B_2$ ($22A_2$), between the Si substrate 21 and the metallic film 22B1 ($22A_1$), and between the metallic film 22B2 and the light condensing section 10 (specifically, the color filter 12) ($22A_3$), and planarizes the recess of the Si substrate 21 formed by the step part 20A.

As the material of the interlayer insulating film 22A, for example, an inorganic material may be used. Specifically, examples thereof may include a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. A thickness of the interlayer insulating film 22A, specifically, the thickness of the interlayer insulating film 22A in the image pickup pixel 2A may be, for example, 100 µm or larger and 1000 µm or lower.

The metallic film 22B ($22B_1$ and $22B_2$) may be an electrode configuring a drive transistor corresponding to each pixel 2, and examples of a material of the metallic film 22B may include simple substance of metal elements such as aluminum (Al), chromium (Cr), gold (Au), platinum (Pt), nickel (Ni), copper (Cu), tungsten (W) and silver (Ag), or an alloy thereof.

Incidentally, as described above, the metallic film 22B typically has a size suitable for a size between the pixels 2 so as to ensure the aperture ratio of the pixel 2 and so as not to shield the light emitted from the optical functional layer of the on-chip lens 11 or the like. Incidentally, in the present embodiment, since the metallic film $22B_1$ provided on the Si substrate 21 side also serves as the light shielding film 14, the metallic film 22B is formed along the step of the interlayer insulating film $22A_1$ formed by the step part 20A so as to cover a wall surface 22C of the step part, as illustrated in FIG. 11.

As a result, entering of the light that has passed through the on-chip lens 11 of the image pickup pixel 2A to the photodiode 23 of the adjacent image plane phase difference pixel 2B and entering of the light that has passed through the on-chip lens 11 of the image plane phase difference pixel 2B to the photodiode 23 of the adjacent image pickup pixel 2A are suppressed. Further, the metallic film $22B_1$ provided between the image plane phase difference pixels 2B is expanded to a predetermined position in the photodetection region R of the image plane phase difference pixel 2B so as to also serve as the light shielding film 14B for pupil division.

Also, the metallic film $22B_1$ provided between the image pickup pixels 2A, the metallic film $22B_1$ provided between the image pickup pixel 2A and the image plane phase difference pixel 2B, and the metallic film $22B_1$ provided on a side where the light shielding film for pupil division is not formed between the image plane phase difference pixels 2B adjacent to each other are each formed in a predetermined size so as to also serve as the light shielding film 14C.

Note that the position where the metallic film $22B_1$ as the light shielding film 14 is formed in the stacking direction of the layers, in particular, the position where the metallic film $B_1$ as the light shielding film 14B between the image plane phase difference pixels 2B is formed may be preferably same as a depth position on which the incident light that has passed through the on-chip lens 11 of the image plane phase difference pixel 2B is condensed, namely, as the position of the surface of the Si substrate 21 of the image pickup pixel 2A.

When the formation position of the metallic film $22B_1$ on the image plane phase difference pixel 2B is higher than the condensing position of the incident light, a part of the luminous fluxes of the incident light is shielded by the metallic film $22B_1$, which results in decrease of the AF characteristics. The same applies to the case where the formation position of the metallic film $22B_1$ on the image plane phase difference pixel 2B is lower than the condensing position of the incident light.

Such a wiring layer 22 may be formed with use of the following manufacturing method, for example. First, for example, a $SiO_2$ film may be formed on the Si substrate 21 provided with the step part 20A with use of, for example, CVD method, and then the interlayer insulating film $22A_1$ may be formed by etching or polishing. The interlayer insulating film $22A_1$ has a step corresponding to the step part 20A provided between the image pickup pixel 2A and the image plane phase difference pixel 2B, and a height of the $SiO_2$ film on the image plane phase difference pixel 2B is substantially equal to a height of the Si substrate 21.

Subsequently, for example, an Al film may be formed on the interlayer insulating film $22A_1$ with use of, for example, sputtering method or vacuum evaporation method, and then patterning may be performed with use of photolithography or etching to form the metallic film $22B_1$ serving also as the light shielding film 14. Next, the interlayer insulating film $22A_2$ is formed on the interlayer insulating film $22A_1$ and the metallic film $22B_1$, and then the metallic film $22B_2$ is formed in a predetermined shape with use of similar method. Finally, the interlayer insulating film $22A_3$ is formed on the interlayer insulating film $22A_2$ and the metallic film $22B_2$ to complete the wiring layer 22.

Figure 12:
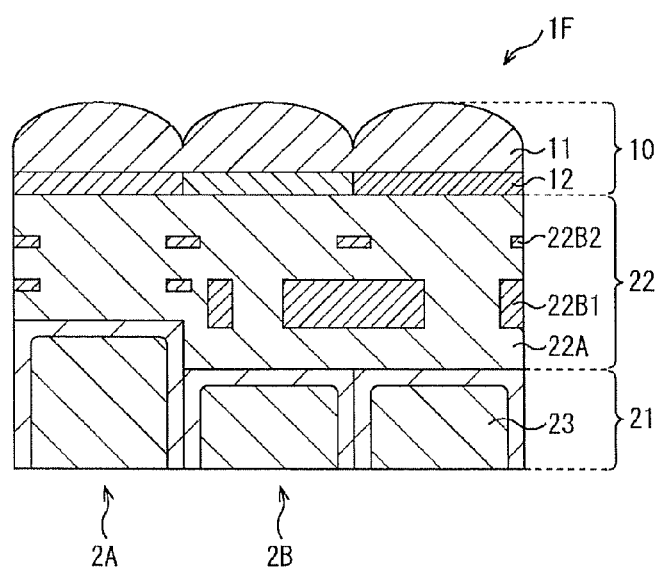
FIG. 12 is a sectional diagram illustrating another example of the image sensor according to the second embodiment of the disclosure.

Note that the metallic film $22B_1$ is formed with use of sputtering method or vacuum evaporation method here; however, the method is not limited thereto, and the metallic film $22B_1$ may be formed with use of, for example, plating method. FIG. 12 illustrates a sectional structure of an image sensor 1F in which the metallic film $22B_1$ is formed with use of plating method. When the metallic film $22B_1$ of the wiring layer 22 in the present embodiment is formed with use of plating method, the thickness of the metallic film 22B1 on the image plane phase difference pixel 2B becomes large as illustrated in FIG. 12.

Further, the wiring layer 22 in which the metallic film 22B has the two-layer structure has been described; however, this is not limitative, and the wiring layer 22 may have a multilayer wiring structure in which the metallic film 22B is formed of three or more layers.

Figure 13:
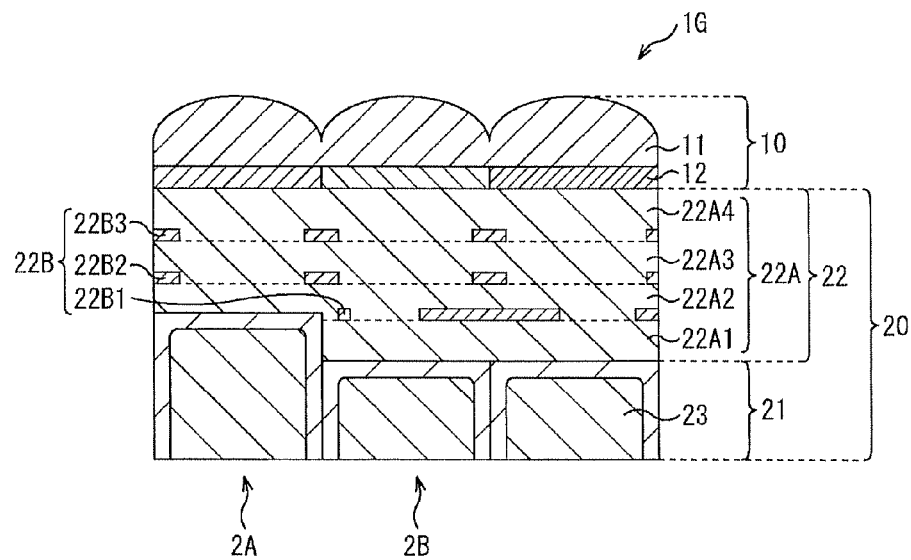
FIG. 13 is a sectional diagram illustrating still another example of the image sensor according to the second embodiment of the disclosure.

FIG. 13 illustrates another example of an image sensor (an image sensor 1G) in the present embodiment. In the image sensor 1G, the metallic film 22B of the wiring layer 22 has three-layer structure ($22B_1$, $22B_2$, and $22B_3$), and the light shielding films 14A and 14C covering the step part 20A in the first embodiment and the like are separately formed of the metallic films $22B_1$ and $22B_2$, respectively.

Such a wiring layer 22 may be formed with use of the following manufacturing method, for example. First, for example, a $SiO_2$ film may be formed on the Si substrate 21 provided with the step part 20A with use of, for example, CVD method, and then the interlayer insulating film $22A_1$ may be formed by etching or polishing. Subsequently, for example, an Al film may be formed on a predetermined position on the interlayer insulating film $22A_1$ with use of, for example, sputtering method or vacuum evaporation method, and then patterning may be performed with use of photolithography or etching to form the metallic film 22B1 serving also as the light shielding film 14.

Specifically, the metallic film $22B_1$ is formed on a position corresponding to the light shielding film 14A covering the side wall 20B of the step part 20A, a position corresponding to the light shielding film 14B for pupil division between the image plane phase difference pixels 2B adjacent to each other, and a position corresponding to the normal light shielding film 14C. Then, the interlayer insulating film $22A_2$ is formed on the interlayer insulating film $22A_1$ and the metallic film $22B_1$, and then the metallic film $22B_2$ is formed in a predetermined shape with use of similar method. Further, the interlayer insulating film $22A_3$ and the metallic film $22B_3$ are formed. Finally, the interlayer insulating film $22A_4$ is formed on the interlayer insulating film $22A_2$ and the metallic film $22B_2$ to complete the wiring layer 22.

In the image sensor 1G illustrated in FIG. 13, as described above, the light shielding film 14 in the first embodiment and the like is formed of two layers, the metallic film $22B_1$ and the metallic film $22B_2$ provided on different layers. Therefore, the metallic film $22B_1$ corresponding to the light shielding film 14A covering the side wall 20B of the step part 20A is discontinuous with the metallic film $22B_2$ serving also as the light shielding film 14C provided on the image pickup pixel 2A.

Note that, as illustrated in FIGS. 11 and 12, when the light shielding film 14 in the first embodiment and the like is formed of one layer of the metallic film $22B_1$ (in other words, formed at the same step), the light shielding films 14A and 14C of the step part 20A are continuously formed. Therefore, high light shielding property is obtainable. On the other hand, when the light shielding film 14 is formed of two layers of the metallic film $22B_1$ and the metallic film $22B_2$ as illustrated in FIG. 13, it is possible to form each of the interlayer insulating film 22A ($22A_1$, $22A_2$, $22A_3$, and $22A_4$) and the metallic film 22B ($22B_1$, $22B_2$, and $22B_3$) of the wiring layer 22 with ease.

Moreover, the color filter 12 of the image plane phase difference pixel 2B in the present embodiment may be preferably assigned with green (G) or white (W), similarly to the first embodiment; however, when light having high quantity enters the image plane phase difference pixel 2B, the charge is easily saturated in the photodiode 23. At this time, in the case of the surface irradiation type, excess charge is discharged from a lower side of the Si substrate 21 (from the substrate 21 side). Accordingly, a lower part of the Si substrate 21 at a position corresponding to the image plane phase difference pixel 2B, specifically, a lower part of the photodiode 23 may be doped with p-type impurity with higher concentration to raise overflow barrier.

In this way, the present disclosure is applicable to the surface irradiation type image sensor without being limited to the backside irradiation type image sensor, and it is possible to obtain effects equivalent to those in the above-described first embodiment and the like even in the case of the surface irradiation type.

5. Third Embodiment

As a third embodiment, a backside irradiation type image sensor in which a step part is provided between a first pixel and a second pixel, a first light shielding section is provided on side walls of the step part, and an inner lens is further provided is described as an example.

As described with reference to FIG. 7A, FIG. 7B, FIG. 8A, and FIG. 8B, for example, the pixel 2 illustrated in FIG. 3 may be designed in such a manner that incident light in the image pickup pixel 2A is condensed near the photodetection surface 20S and incident light in the image plane phase difference pixel 2B is condensed at the same depth position as that of the light shielding film 14B for pupil division. Accordingly, similarly to the image pickup pixel 2A, the image plane phase difference pixel 2B is also configured in such a manner that luminous fluxes of substantially all of the incident light that have passed through the on-chip lens 11 are applied to the photodiode 23.

As described with reference to FIG. 7B and FIG. 8B, it is found from comparison between the characteristic diagram of FIG. 7A and the characteristic diagram of FIG. 8B that the photodetection efficiency of the image plane phase difference pixel 2B in which the photodetection surface 20S is disposed at the position deeper than that of the image pickup pixel 2A is higher than the photodetection efficiency of the image pickup pixel 2A, namely, the characteristics of pupil intensity distribution of the image plane phase difference pixel 2B are sharper than those of the image pickup pixel 2A. In other words, it becomes possible for the image plane phase difference pixel 2B of the image sensor 1 in the present embodiment to generate the signal for phase difference detection with accuracy higher than that of the image plane phase difference pixel 102B of the image sensor 100 in the comparative example, in phase difference detection.

Moreover, in the present embodiment, providing the light shielding film 14A on the side wall 20B of the step part 20A suppresses color mixing caused by crosstalk of the oblique incident light between the pixels adjacent to each other.

However, providing the photodetection surface 20S of the image plane phase difference pixel 2B at a position deeper than the photodetection surface 20S of the image pickup pixel 2A may influence the image pickup characteristics of the image plane phase difference pixel 2B. Referring to FIG. 3 again, the image plane phase difference pixel 2B is larger in carved amount of the Si substrate 21 than the image pickup pixel 2A. Therefore, the photodiode 23 of the image plane phase difference pixel 2B is formed to be smaller in size than the photodiode 23 of the image pickup pixel 2A.

When the photodiode 23 is configured as described above, the image pickup characteristics of the photodiode 23 of the image plane phase difference pixel 2B may be deteriorated, for example, the number of saturation electrons of the photodiode 23 of the image plane phase difference pixel 2B may become lower than that of the photodiode 23 of the image pickup pixel 2A.

Figure 14:
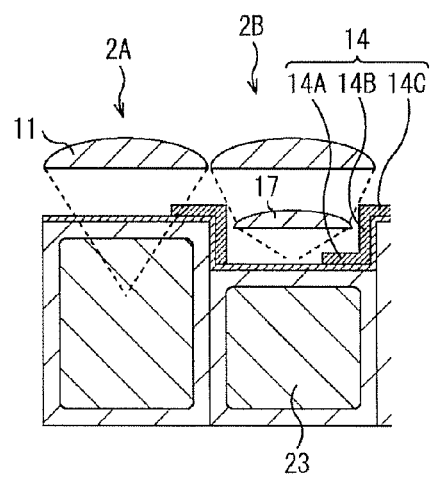
FIG. 14 is a sectional diagram illustrating an example of an image sensor according to a third embodiment of the disclosure.

Thus, as illustrated in FIG. 14, an inner lens is provided in the image plane phase difference pixel 2B. FIG. 14 is a diagram illustrating a structure of the pixel 2 in the third embodiment. In FIG. 14, the wiring layer 22 is not illustrated, and the structure of the light condensing section 10 is illustrated in a simplified manner for description.

The image plane phase difference pixel 2B illustrated in FIG. 14 has an inner lens 17. The inner lens 17 is provided between the on-chip lens 11 and the photodiode 23. Further, the inner lens 17 is provided in the image plane phase difference pixel 2B, and is not provided in the image pickup pixel 2A. For example, when a plurality of image plane phase difference pixels 2B are provided continuously as illustrated in FIG. 5, the inner lens 17 may be used commonly to the plurality of image plane phase difference pixels 2B.

When the inner lens 17 is provided as described above, light condensed by the on-chip lens 11 is further condensed by the inner lens 17 as illustrated in FIG. 14. With such a structure, it is possible to provide the photodetection surface 20S of the image plane phase difference pixel 2B on an upper side (on the on-chip lens 11 side) as compared with the photodetection surface 20S of the image plane phase difference pixel 2B without the inner lens 17 illustrated in FIG. 3.

Specifically, it becomes possible to reduce the carved amount of the Si substrate 21 of the image plane phase difference pixel 2B as compared with the image plane phase difference pixel 2B without the inner lens 17 illustrated in FIG. 3. As a result, it becomes possible to make the photodiode 23 of the image plane phase difference pixel 2B larger than the photodiode 23 of the image plane phase difference pixel 2B without the inner lens 17.

Therefore, it is possible to configure the image plane phase difference pixel 2B that suppresses deterioration of the image pickup characteristics caused by decrease of the saturation electron amount of the photodiode of the image plane phase difference pixel 2B.

In addition, basically, the image plane phase difference pixel 2B illustrated in FIG. 14 has a similar structure of the image plane phase difference pixel 2B illustrated in FIG. 3 except that the inner lens 17 is provided. Therefore, effects obtained by the image plane phase difference pixel 2B illustrated in FIG. 3 are obtainable also by the image plane phase difference pixel 2B illustrated in FIG. 14. In other words, for example, similarly to the image pickup pixel 2A, it is possible to configure the image plane phase difference pixel 2B in such a manner that the luminous fluxes of substantially all of the incident light that have passed through the on-chip lens 11 are applied to the photodiode 23, and it is possible to generate a signal for phase difference detection with higher accuracy.

Figure 15:
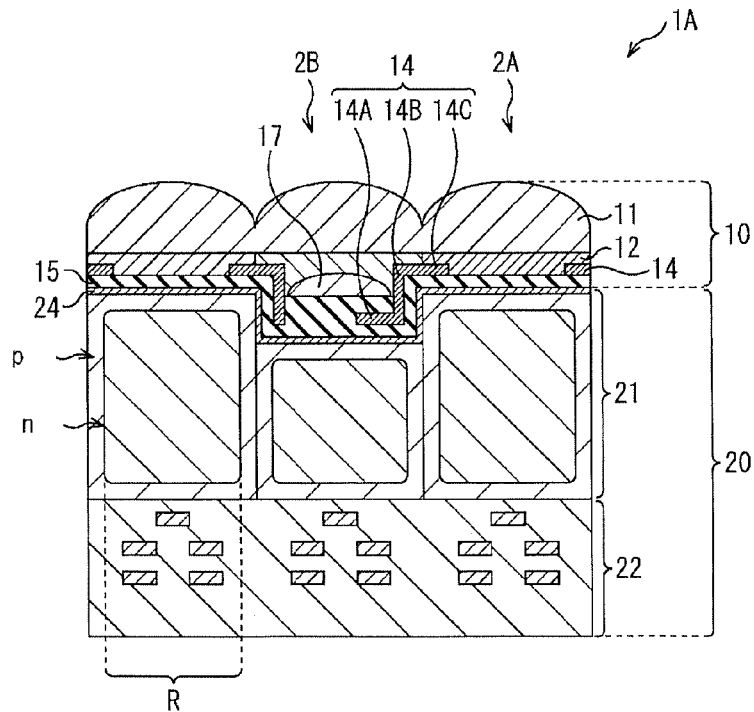
FIG. 15 is a sectional diagram illustrating an example of the image sensor according to the third embodiment of the disclosure.

FIG. 15 is a diagram illustrating a structure of the pixel 2 in a case where the inner lens 17 is provided in the image plane phase difference pixel 2B illustrated in FIG. 3.

In the image plane phase difference pixel 2B illustrated in FIG. 15, the insulating film 15 that has a predetermined height of the light shielding film 14B is provided between the light shielding films 14B, namely, on a part corresponding to the step part 20A. Incidentally, description is given for an example in which the insulating film 15 is provided on a lower side and an upper side of the light shielding film 14A. However, for example, as with the image plane phase difference pixel 2B illustrated in FIG. 3, the insulating film 15 may be provided on the lower side of the light shielding film 14A, and the planarizing film 13 may be provided on the upper side of the light shielding film 14A.

As described above, examples of the material of the insulating film 15 may include a silicon oxide film ($SiO_2$), a silicon nitride film (SiN), and a silicon oxynitride film (SiON). Examples of the material of the planarizing film 13 may include a silicon oxynitride film ($SiO_2$), a silicon nitride film (SiN), and silicon oxynitride film (SiON). When the same material is used for the insulating film 15 and the planarizing film 13, a film formed of the same material is formed on each of the lower side and the upper side of the light shielding film 14A as illustrated in FIG. 15.

Such difference depends on the manufacturing step and the material to be used. Here, first, description is given for an example in which a film made of the same material is formed on each of the lower side and the upper side of the light shielding film 14A, and description is successively given while the formed film is referred to as the insulating film 15.

Incidentally, in this case, functionally, the film on the lower side of the light shielding film 14A has a function of preventing damage of the Si substrate 21 in processing of the light shielding film 14, and the film on the upper side has a function of planarizing the photodetection surface 20S of the photodetection section 20 and the lower surface of the inner lens 17.

The inner lens 17 is formed on the insulating film 15 formed between the insulating films 14B. Examples of the material of the inner lens 17 may include a silicon nitride film (SiN). Further, for example, examples of the material of the inner lens 17 may include a siloxane-based resin (refractive index 1.7) and a high refractive index resin such as polyimide. Further, the above-described resin may contain metal oxide microparticles of, for example, titanium oxide, tantalum oxide, niobium oxide, tungsten oxide, zirconium oxide, zinc oxide, indium oxide, and hafnium oxide to enhance refractive index.

The color filter 12 is formed on the inner lens 17. In this way, in the image plane phase difference pixel 2B illustrated in FIG. 15, the color filter 12 is formed on the inner lens 17; however, a planarizing organic film 18 may be provided on the inner lens 17, and the color filter 12 may be formed on the planarizing organic film 18, as illustrated in FIG. 16.

Figure 16:
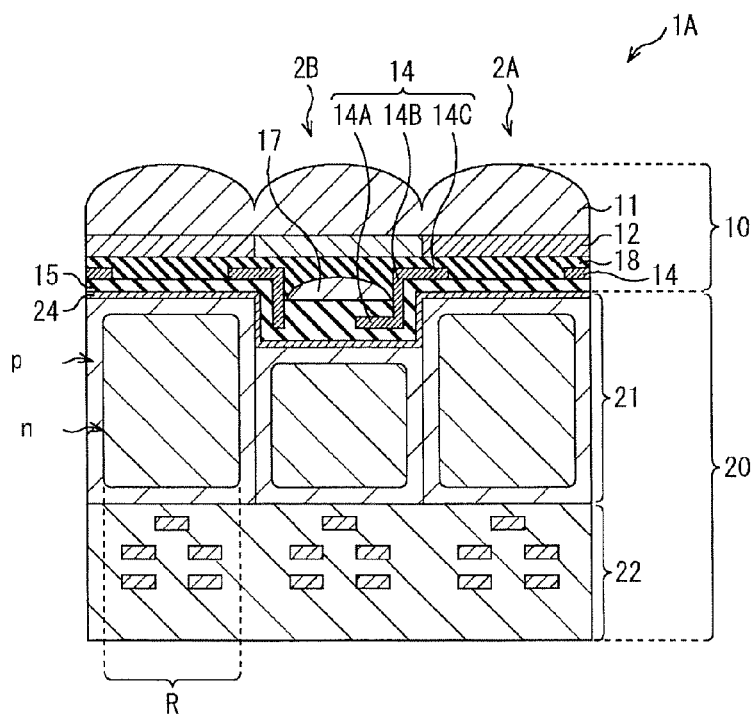
FIG. 16 is a sectional diagram illustrating an example of the image sensor according to the third embodiment of the disclosure.

In the image plane phase difference pixel 2B illustrated in FIG. 16, the planarizing organic film 18 is formed between the inner lens 17 and the color filter 12. The planarizing organic film 18 may be provided below the color filter 12 as with the image plane phase difference pixel 2B illustrated in FIG. 16, or the inner lens 17 may be directly provided below the color filter 12 without providing the planarizing organic film 18 as with the image plane phase difference pixel 2B illustrated in FIG. 15.

Figure 17:
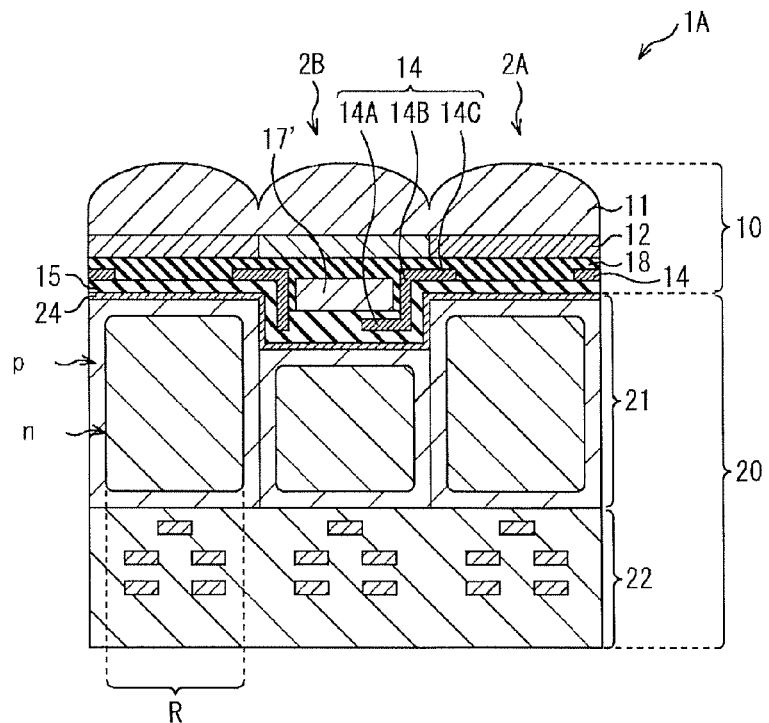
FIG. 17 is a sectional diagram illustrating an example of the image sensor according to the third embodiment of the disclosure.

Further, the inner lens 17 may not have a curved shape (an upward convex structure) illustrated in FIG. 15 and FIG. 16 but may have a rectangular shape (a box shape) as illustrated in FIG. 17. An inner lens 17' illustrated in FIG. 17 has a rectangular sectional surface. The rectangular inner lens 17' has a feature of condensing light in a pixel having a reduced size. Moreover, the rectangular inner lens 17' is easily manufactured as compared with the curved inner lens 17.

Here, although the curved inner lens 17 and the rectangular inner lens 17' have been described as examples, the inner lens may have other shapes.

Moreover, the example in which one inner lens is provided in a vertical direction, namely, between the color filter 12 and the photodiode 23 has been described here. However, the number of inner lens is not limited to one, and a plurality of inner lenses may be provided while being overlapped. In addition, when the plurality of inner lenses are provided, inner lenses having shapes different from one another may be combined and used.

Figure 18:
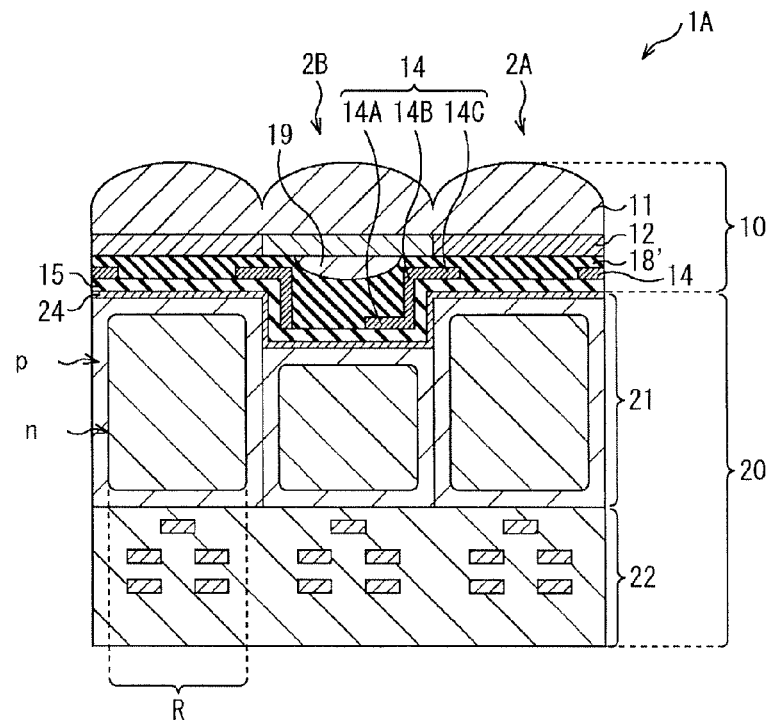
FIG. 18 is a sectional diagram illustrating an example of the image sensor according to the third embodiment of the disclosure.

The inner lenses illustrated in FIG. 15 to FIG. 17 are each provided on the photodiode 23 side as an example; however, a configuration in which an inner lens 19 is provided on the color filter 12 side as illustrated in FIG. 18 may be employed.

The step part 20A of the image plane phase difference pixel 2B illustrated in FIG. 18 is filled with a planarizing organic film 18'. In the image plane phase difference pixel 2B, the S substrate 21 is carved by an amount of the step part 20A as compared with the image pickup pixel 2A. Therefore, it is possible to form the planarizing organic film 18' such that a recess is formed, with use of the carving.

For example, depression may be formed in the image plane phase difference pixel 2B by self-alignment, and the inner lens 19 may be formed in the depression. The inner lens 19 to be formed is an inner lens having a downward convex shape (having a curved shape on a down side) as illustrated in FIG. 18.

Note that, in the example illustrated in FIG. 18, the example in which the step part 20A of the image plane phase difference pixel 2B is filled with the planarizing organic film 18' is illustrated. However, as illustrated in FIG. 15 to FIG. 17, the step part 20A of the image plane phase difference pixel 2B may be filled with the insulating film 15, or filled with the insulating film 15 and the planarizing organic film 18.

<Manufacture of Image Pickup Device According to Third Embodiment>

Manufacture of the image sensor 1A including the image plane phase difference pixel 2B that includes the inner lens described with reference to FIG. 14 to FIG. 18 is described with reference to FIG. 19 to FIG. 21. Note that a case where the image sensor 1A including the image plane phase difference pixel 2B illustrated in FIG. 16 is manufactured is described as an example here.

Figure 19:
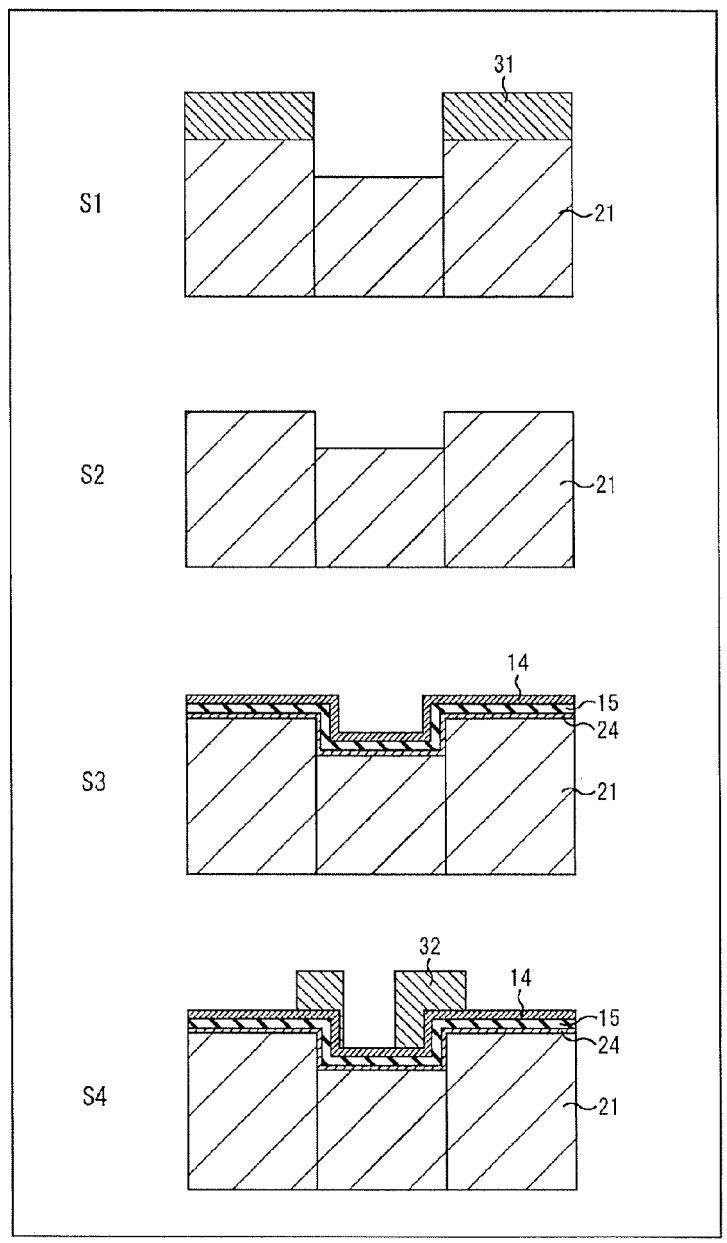
FIG. 19 is a diagram for explaining manufacture of the image sensor according to the third embodiment of the disclosure.

At step S1 illustrated in FIG. 19, a mask 31 is formed on the photodetection surface side of the backside irradiation type solid-state image pickup device. The mask 31 is formed at parts other than parts to be the image plane phase difference pixels 2B. Then, the Si substrate 21 corresponding to the image plane phase difference pixel 2B is etched.

In this etching, plasma etching and wet etching may be used. Incidentally, when wet etching of silicon is performed, nitrohydrofluoric acid or alkali may be preferably used, and in this case, a hard mask of an oxide film or a nitride film may be preferably used.

At step S2, the mask 31 is peeled off after the etching of the Si substrate 21. In the case of a resist mask, ashing or sulfuric acid/hydrogen peroxide mixture is used, and in the case of a hard mask of an oxide film or a nitride film, hydrofluoric acid is used.

At step S3, each of the fixed charge film 24, the insulating film 15, and the light shielding film 14 is formed on the front surface of the Si substrate 21. The fixed charge film 24 may be formed as an antireflection film. For example, hafnium oxide ($HfO_2$), aluminum oxide ($Al_2O_3$), zirconium oxide ($ZrO_2$) film, tantalum oxide ($Ta_2O_5$), or titanium oxide ($TiO_2$), or a stacked-layer film thereof may be used for the antireflection film (the fixed charge film 24).

After the fixed charge film 24 is formed, the insulating film 15 is formed. The insulating film 15 also functions as an interlayer film provided between the fixed charge film 24 and the light shielding film 14. For example, a silicon oxide film ($SiO_2$), a silicon nitride film (SiN), or a silicon oxynitride film (SiON) may be used for the insulating film 15.

As the method of forming the insulating film 15, CVD method and ALD method are used; however, a formation method excellent in side coverage may be preferably selected in order to form the insulating film 15 on the side wall of the step part 20A of the image plane phase difference pixel 2B.

After the insulating film 15 is formed, the light shielding film 14 is formed. For example, tungsten (W), aluminum (Al), an alloy of Al and copper (Cu) may be used for the light shielding film 14. As the method of forming the insulating film 14, PDV method, CVD method, and ALD method are used; however, a formation method excellent in side coverage may be preferably selected in order to form the light shielding film 14 on the side wall of the step part 20A of the image plane phase difference pixel 2B.

Figure 20:
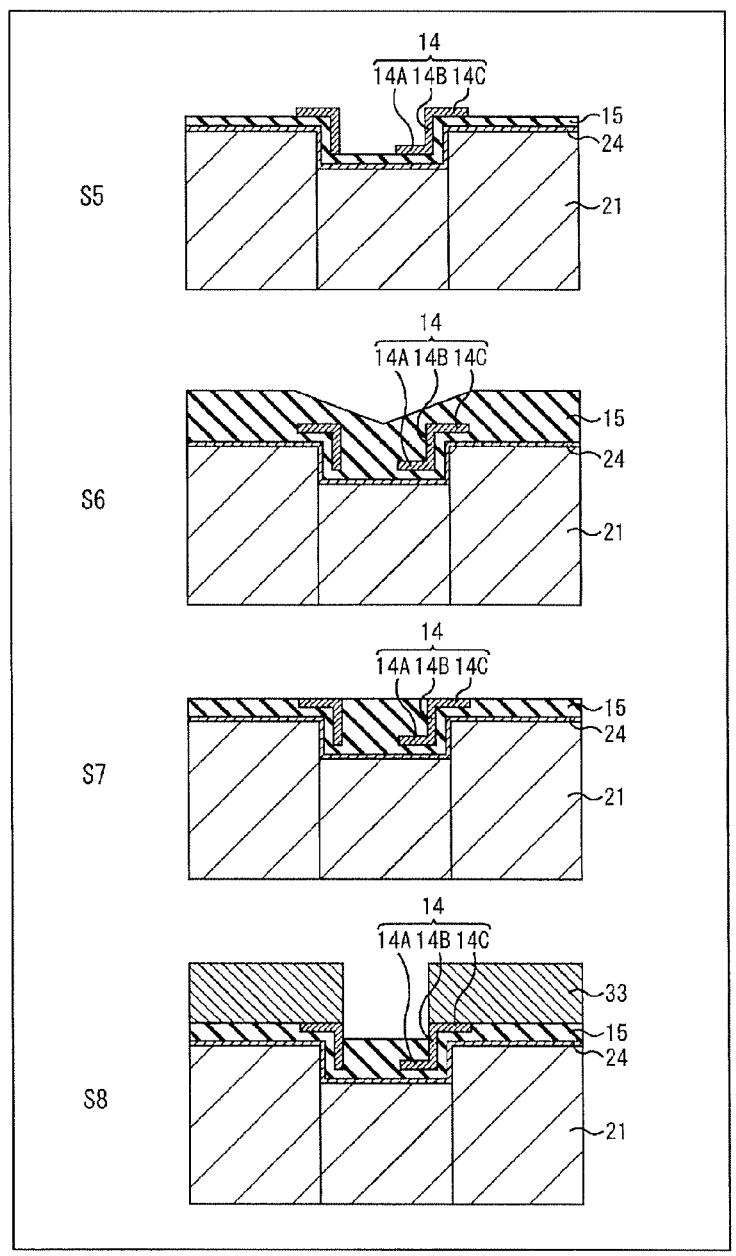
FIG. 20 is a diagram for explaining the manufacture of the image sensor according to the third embodiment of the disclosure.

At step S5 illustrated in FIG. 20, lithography to remove unnecessary part of the light shielding film 14 to process the light shielding film 14 is performed. Since the step part 20A exists in the image plane phase difference pixel 2B, an exposure method in which focus is adjusted on both of the bottom surface and the top surface of the step part 20A may be preferably used.

At the step S5, the light shielding film 14 is processed by dry etching. For example, in the processing, resist is peeled off by ashing after dry etching to form the light shielding film 14A, the light shielding film 14B, and the light shielding film 14C.

At step S6, a part of the insulating film 15 is formed. The light shielding film 15 that is charged in the step part 20A of the image plane phase difference pixel 2B to allow the inner lens to be formed on the planarized film is formed on the already formed insulating film 15.

In the formation of the insulating film 15 at the step S6, high density plasma (HDP) method may be preferably used to form the insulating film 15 because the step part 20A of the image plane phase difference pixel 2B may be preferably planarized at subsequent step S7.

As illustrated in FIG. 20, the insulating film 15 formed at the step S6 is formed in a shape including a recess on a part of the image plane phase difference pixel 2B since the step part 20A exists in the image plane phase difference pixel 2B.

At the step S7, chemical mechanical polishing (CMP) is used to planarize the oxide film. As illustrated in FIG. 20, the oxide film is polished up to the upper surface of the light shielding film 14C, and as a result, the oxide film is planarized.

At step S8, the surface other than the step part 20A of the image plane phase difference pixel 2B is covered with a resist mask 33, and etch back is performed by dry etching. As a result, a space (a space where the inner lens is formed) configuring light condensing structure is secured at the step part 20A of the image plane phase difference pixel 2B.

In the case of the configuration in which the step part 20A is filled with the planarizing organic film 18' as illustrated in FIG. 18, the planarizing organic film 18' is first formed at the step S6 out of the step S6 to step S8. The planarizing organic film 18' is also formed by the method same as the film formation of the insulating film 15 described above.

Further, the planarizing organic film 18' is also formed in a shape in which a recess is generated on a part of the image plane phase difference pixel 2B because the step part 20A exists in the image plane phase difference pixel 2B as illustrated in FIG. 20. It is possible to form the inner lens 19 (FIG. 18) with use of the recess.

Specifically, for example, the planarizing organic film 18' may be formed to have the recess with a predetermined depth at the step S6, and polishing may be performed at the step S7 while remaining the space where the inner lens 19 (FIG. 18) is to be formed. As a result, it is possible to form the space where the inner lens 19 is to be formed. In this case, the step S8 may be omitted.

Moreover, at the step S8, it is also possible to form such a recess where the inner lens 19 is to be formed. The position, the size, the curvature, the depth, etc. of the recess where the inner lens 19 is to be formed may be arbitrary controlled by an opening of the resist mask, etching time, etc.

The description is returned to manufacture with reference to FIG. 20. When the space where the inner lens is to be formed is formed at the step S8, the processing proceeds to step S9 illustrated in FIG. 21.

At the step S9, a high refractive index material, for example, a silicon nitride (SiN) film 34 may be formed. The silicon nitride film 34 to be formed becomes a material of the inner lens. Although the silicon nitride film 34 is described as an example here, a film of a material matched with the inner lens to be formed is formed at the step S9.

At step S10, lithography of the inner lens is performed on the step part 20A of the image plane phase difference pixel 2B. A mask 35 matched with the desired shape of the inner lens is formed.

At step S11, dry etching is performed to form the inner lens 17 on the step part 20A of the image plane phase difference pixel 2B.

Figure 21:
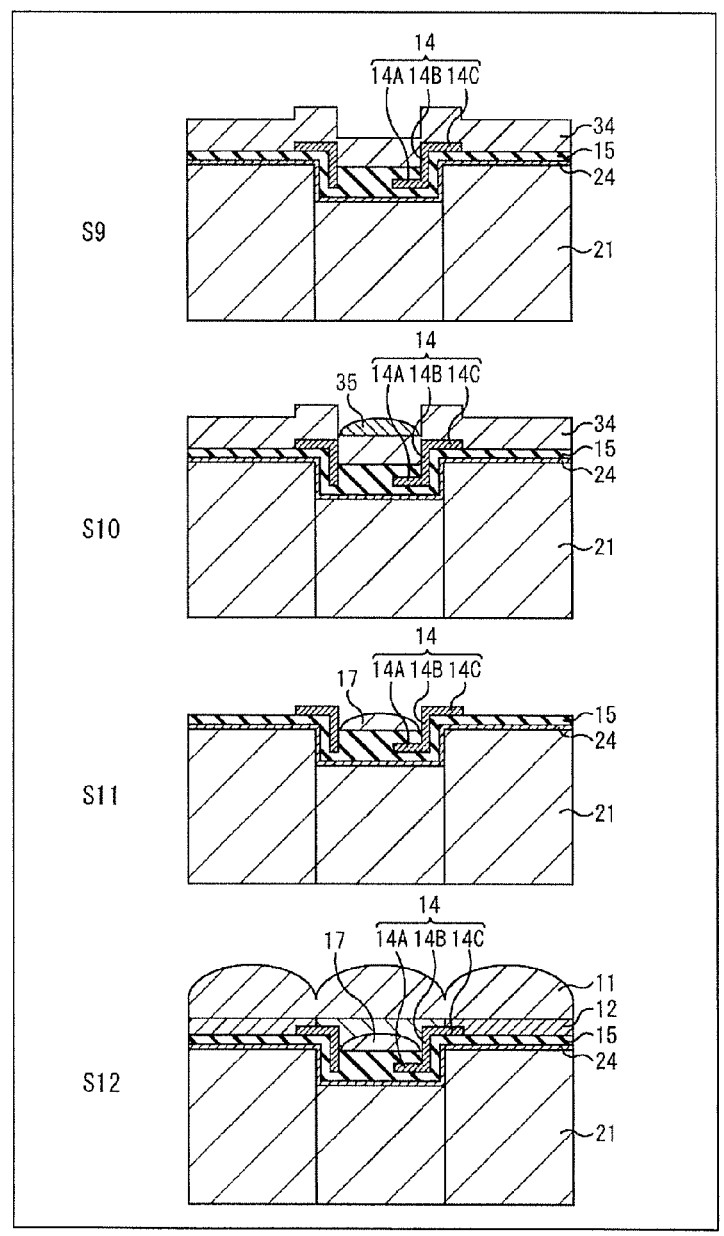
FIG. 21 is a diagram for explaining the manufacture of the image sensor according to the third embodiment of the disclosure.

When the mask 35 is formed in a curved shape as illustrated in FIG. 21 at the step S10, the curved inner lens 17 illustrated in FIG. 15 and FIG. 16 is formed. When the mask 35 is formed in a rectangular shape at the step 10 although not illustrated, the rectangular inner lens 17' illustrated in FIG. 17 is formed.

In this way, the mask 35 matched with the shape of the inner lens to be formed is formed and the etching is performed. As a result, the curved inner lens or the rectangular inner lens is formed.

At step S12, the color filter 12 is formed on the formed inner lens 17 and the formed insulating film 15, and the on-chip lens 11 is formed on the color filter 12. In this way, the image sensor 1A including the image plane phase difference pixel 2B illustrated in FIG. 15 is formed.

When the image sensor 1A including the image plane phase difference pixel 2B illustrated in FIG. 16 or FIG. 17 is formed, after the planarizing organic film 18 is formed on the inner lens 17 (or the inner lens 17') at the step S12, the color filter 12 is formed and the on-chip lens 11 is then formed.

In this way, the image sensor 1A including the image plane phase difference pixel 2B that includes the inner lens is manufactured.

When the inner lens is provided on such an image plane phase difference pixel 2B, it is possible to suppress deterioration of the image pickup characteristics, for example, reduction of saturation electron amount of the image plane phase difference pixel 2B without impairing focus detection accuracy of the image plane phase difference pixel 2B.

Further, when the image plane phase difference pixel 2B is used also as a pixel for image pickup, it is possible to configure the image sensor 1A that is capable of simply correcting an image with less difference of the image pickup characteristics from those of the image pickup pixel 2B.

6. Application Examples

Hereinafter, application examples of the image sensors 1 described in the above-described first, second, and third embodiments are described. All of the image sensors 1 in the above-described embodiments are applicable to electronic apparatuses in various fields. Here, as examples, an image pickup apparatus (a camera), an endoscope camera, and a vision chip (an artificial retina) are described.

Application Example 1

Figure 22:
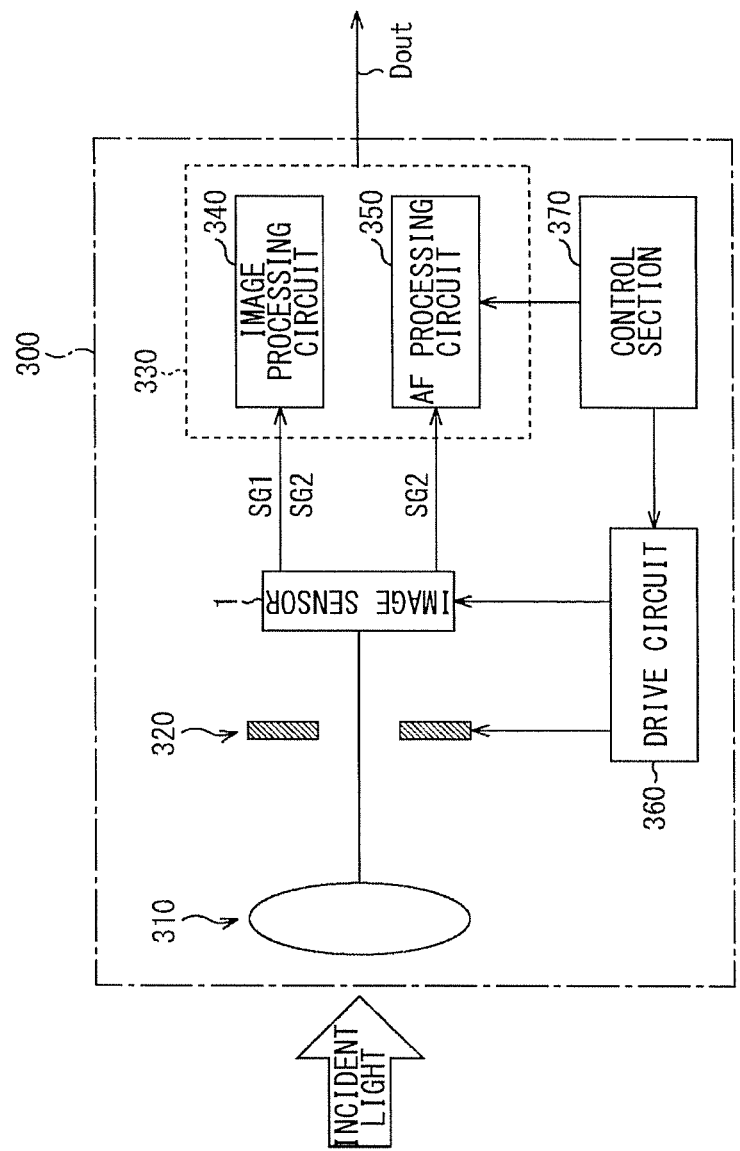
FIG. 22 is a functional block diagram illustrating an entire configuration according to an application example 1 (an image pickup apparatus).

FIG. 22 is a functional block diagram illustrating an entire configuration of the image pickup apparatus (an image pickup apparatus 300). The image pickup apparatus 300 may be, for example, a digital still camera or a digital video camera, and may include an optical system 310, a shutter device 320, the image sensor 1 (for example, the image sensor 1A), a signal processing circuit 330 (an image processing circuit 340 and an AF processing circuit 350), a drive circuit 360, and a control section 370.

The optical system 310 include one or a plurality of image pickup lenses each forming an image of picked-up image light (incident light) from an object on an image pickup surface of the image sensor 1. The shutter device 320 controls a light application period (an exposure period) and a light shielding period with respect to the image sensor 1. The drive circuit 360 performs open-close driving of the shutter device 320, and drives exposure operation and signal readout operation in the image sensor 1.

The signal processing circuit 330 performs predetermined signal processing, for example, various correction processing such as demosaic processing and white balance adjustment processing on output signals (SG1 and SG2) from the image sensor 1. The control section 370 may be configured of, for example, a microcomputer, and controls the shutter driving operation and the image sensor driving operation in the drive circuit 360 and controls the signal processing operation in the signal processing circuit 330.

In the image pickup apparatus 300, when incident light is detected by the image sensor 1 through the optical system 310 and the shutter unit 320, signal charge based on the amount of the detected light is accumulated in the image sensor 1. The signal charge accumulated in each pixel 2 of the image sensor 1 (the electric signal SG1 obtained from the image pickup pixel 2A and the electric signal SG2 obtained from the image plane phase difference pixel 2B) is read out by the drive circuit 360, and the read electric signals SG1 and SG2 are output to the image processing circuit 340 and the AF processing circuit 350 of the signal processing circuit 330.

The output signals output from the image sensor 1 are subjected to predetermined signal processing by the signal processing circuit 330, and the processed signal is output to outside (a monitor, or the like) as a picture signal Dout, or retained in a storage section (a storage medium) such as a unillustrated memory.

Application Example 2

Figure 23:
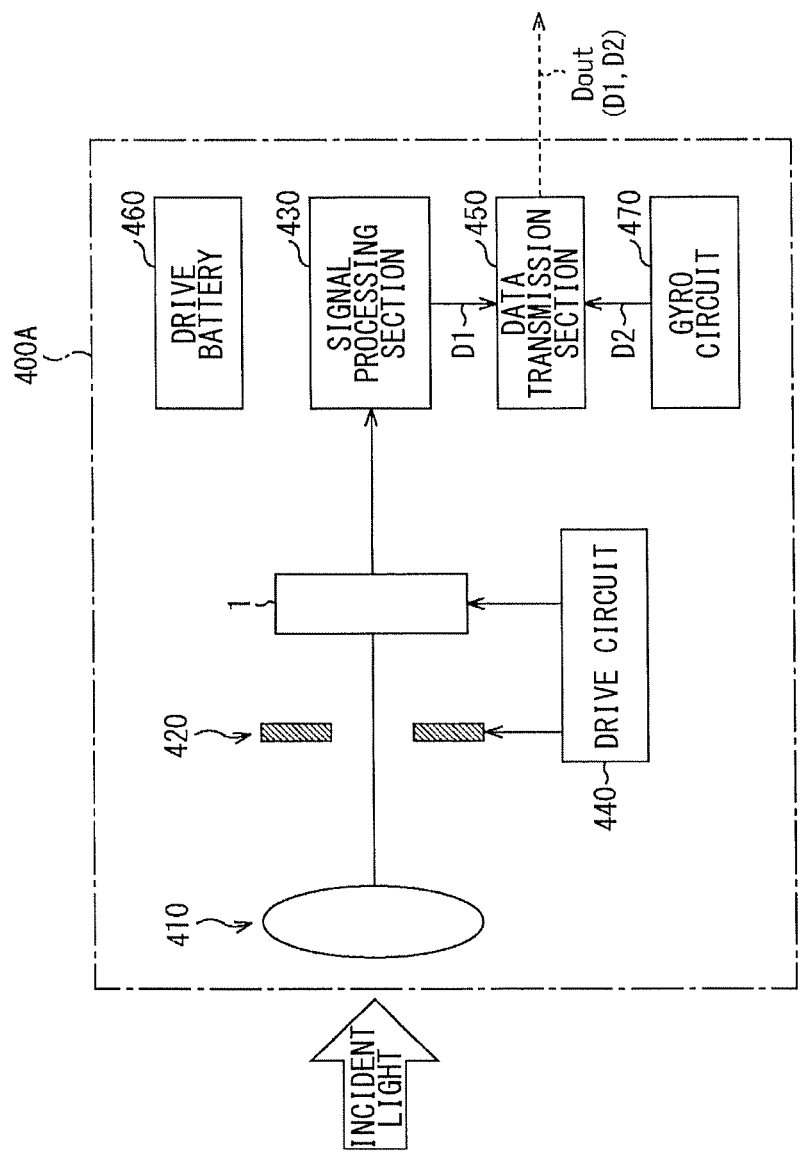
FIG. 23 is a functional block diagram illustrating an entire configuration according to an application example 2 (a capsule endoscope camera).

FIG. 23 is a functional block diagram illustrating an entire configuration of the endoscope camera (a capsule endoscope camera 400A) according to an application example 2. The capsule endoscope camera 400A includes an optical system 410, a shutter device 420, the image sensor 1, a drive circuit 440, a signal processing circuit 430, a data transmission section 450, a drive battery 460, and an attitude (direction and angle) sensing gyro circuit 470.

Among them, the optical system 410, the shutter device 420, the drive circuit 330, and the signal processing circuit 430 have functions similar to those of the optical system 310, the shutter device 320, the drive circuit 360, and the signal processing circuit 330 described in the above-described image pickup apparatus 300, respectively. Note that the optical system 410 may be desirably adapted to pick up an image in a plurality of azimuth directions (for example, all-around) in four-dimensional space, and may be configured of one or a plurality of lenses. Incidentally, in this example, a picture signal D1 subjected to the signal processing by the signal processing circuit 430 and an attitude sensing signal D2 output from the gyro circuit 470 are transmitted to an external apparatus through the data transmission section 450 via wireless communication.

Figure 24:
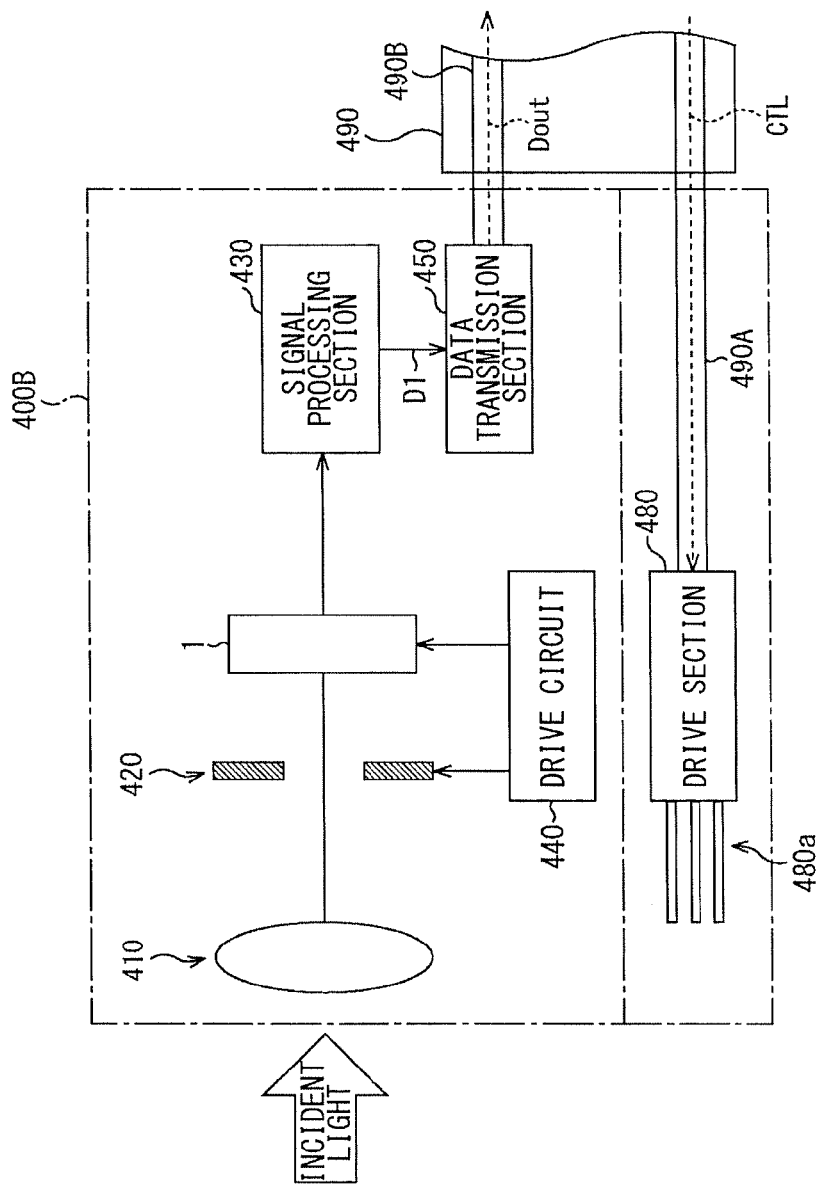
FIG. 24 is a functional block diagram illustrating an entire configuration according to another example of the endoscope camera (an insertion endoscope camera).

Note that the endoscope camera to which the image sensor in any of the above-described embodiments is applicable is not limited to the above-described capsule endoscope camera, and for example, may be an insertion endoscope camera (an insertion endoscope camera 400B) as illustrated in FIG. 24.

The insertion endoscope camera 400B includes the optical system 410, the shutter device 420, the image sensor 1, the drive circuit 440, the signal processing circuit 430, and the data transmission section 450, similar to a part of the configuration of the above-described capsule endoscope camera 400A. Incidentally, the insertion endoscope camera 400B further includes an arm 480a storable in the device and a drive section 480 configured to drive the arm 480a. Such an insertion endoscope camera 400B is connected to a cable 490 that includes a wiring 490A transmitting an arm control signal CTL to the drive section 480 and a wiring 490B transmitting a picture signal Dout based on the picked-up image.

Application Example 3

Figure 25:
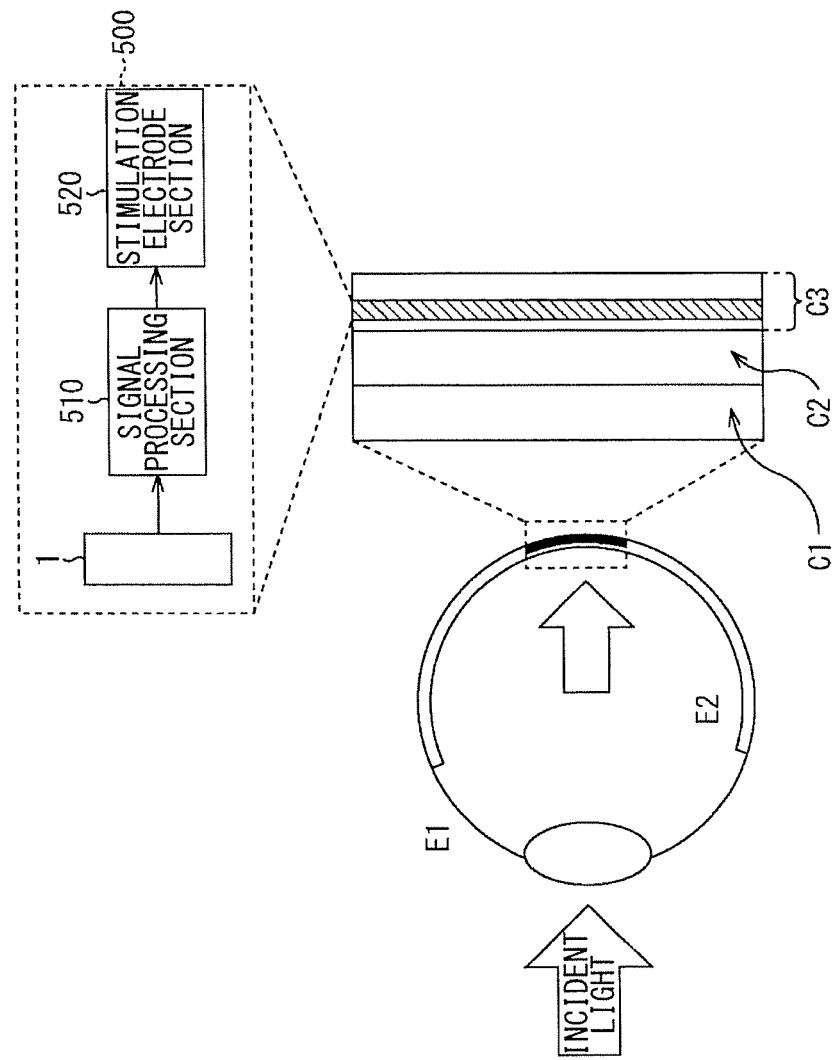
FIG. 25 is a functional block diagram illustrating an entire configuration according to an application example 3 (a vision chip).

FIG. 25 is a functional block diagram illustrating an entire configuration of the vision chip (a vision chip 500) according to an application example 3. The vision chip 500 is an artificial retina buried in a part of an inner wall (a retina E2 having visual nerve) of an eyeball E1 for use. The vision chip 500 may be buried in a part of any of a ganglion cell C1, a horizontal cell C2, and a visual cell C3 of the retina E2, and may include, for example, the image sensor 1, a signal processing circuit 510, and a stimulation electrode section 520.

Thus, the vision chip 500 obtains the electric signal based on incident light to the eye by the image sensor 1, processes the electric signal by the signal processing circuit 510, and supplies a predetermined control signal to the stimulation electrode section 520. The stimulation electrode section 520 has a function of applying stimulus (the electric signal) to the visual nerve in response to the input control signal.

Hereinbefore, although the disclosure has been described with reference to the first, second, and third embodiments, the disclosure is not limited to the above-described embodiments and the like, and various modifications may be made. Another optical functional layer may be provided between the on-chip lens and the photodetection section. Moreover, a multiple lens structure in which a lens (a so-called inner lens) is further provided below the on-chip lens 11, specifically between the on-chip lens 11 and the photodetection section 20 may be employed.

Note that the technology may be configured as follows.

(1) An image pickup device including
a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, wherein
at least a part of a wall surface of the step part is covered with a first light shielding section.

(2) The image pickup device according to (1), wherein
the light condensing section includes a lens as an optical functional layer, and
the lens of the light condensing section of the first pixel has a shape same as the lens of the light condensing section of the second pixel.

(3) The image pickup device according to (2), wherein
the lens of the light condensing section of the first pixel is opposed to the photodetection section of the first pixel, and
the lens of the light condensing section of the second pixel is opposed to the photodetection section of the second pixel.

(4) The image pickup device according to any one of (1) to (3), wherein the wall surface of the step part is perpendicular.

(5) The image pickup device according to any one of (1) to (4), wherein the second pixel includes a second light shielding section that shields a part of the photodetection surface, between the photodetection section and the light condensing section.

(6) The image pickup device according to any one of (1) to (5), wherein the first pixel and the second pixel includes a third light shielding section between the first pixel and the second pixel adjacent to each other.

(7) The image pickup device according to (6), wherein the first light shielding section, the second light shielding section, and the third light shielding section are formed of a same material.

(8) The image pickup device according to any one of (1) to (7), wherein the incident light of the first pixel is condensed near the photodetection surface of the photodetection section.

(9) The image pickup device according to any one of (1) to (8), wherein the incident light of the second pixel is condensed at a depth position same as a depth position of the second light shielding section.

(10) The image pickup device according to any one of (1) to (9), wherein the step part is filled with an organic film.

(11) The image pickup device according to (10), wherein the organic film is formed of one of a polyimide resin, an acrylic resin, a styrene resin, and an epoxy resin.

(12) The image pickup device according to any one of (1) to (11), wherein the first pixel and the second pixel each include a fixed charge film between the photodetection section and the light condensing section.

(13) The image pickup device according to any one of (1) to (12), wherein
the first pixel and the second pixel include a groove between the first pixel and the second pixel adjacent to each other, and
the fixed charge film is provided along wall surfaces and a bottom surface of the groove.

(14) The image pickup device according to (13), wherein the groove is filled with an insulating material.

(15) The image pickup device according to (13), wherein the groove is filled with an insulating material and one of the first light shielding section, the second light shielding section, and the third light shielding section.

(16) The image pickup device according to any one of (1) to (15), wherein
   a drive section including a wiring layer is provided between the light condensing section and the photodetection section, and
   the wiring layer also serves as the first light shielding section, the second light shielding section, and the third light shielding section.
(17) The image pickup device according to any one of (1) to (16), wherein
   the light condensing section includes a color filter of red, green, blue, or while, and
   the light condensing section of the second pixel includes a color filter of green or white.
(18) The image pickup device according to any one of (1) to (17), wherein an inner lens is provided on the step part.
(19) The image pickup device according to (18), wherein the inner lens is an inner lens having an upward convex structure or a downward convex structure, or a rectangular inner lens.
(20) An image pickup apparatus including an image pickup device, the image pickup device including
   a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, wherein
   at least a part of a wall surface of the step part is covered with a first light shielding section.

This application is based upon and claims the benefit of priority of the Japanese Patent Application No. 2013-73054, filed on Mar. 29, 2013, and the Japanese Patent Application No. 2014-49049, filed on Mar. 12, 2014, both filed with the Japan Patent Office, the entire contents of these applications are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup device comprising:
   a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section,
   wherein at least a part of a wall surface of the step part is covered with a first light shielding section, and
   wherein the step part is filled with an organic film.

2. The image pickup device according to claim 1, wherein the light condensing section includes a lens as an optical functional layer, and
   the lens of the light condensing section of the first pixel has a shape same as the lens of the light condensing section of the second pixel.

3. The image pickup device according to claim 2, wherein the lens of the light condensing section of the first pixel is opposed to the photodetection section of the first pixel, and
   the lens of the light condensing section of the second pixel is opposed to the photodetection section of the second pixel.

4. The image pickup device according to claim 1, wherein the wall surface of the step part is perpendicular.

5. The image pickup device according to claim 1, wherein the second pixel includes a second light shielding section that shields a part of the photodetection surface, between the photodetection section and the light condensing section.

6. The image pickup device according to claim 5, wherein the first pixel and the second pixel includes a third light shielding section between the first pixel and the second pixel adjacent to each other.

7. The image pickup device according to claim 6, wherein the first light shielding section, the second light shielding section, and the third light shielding section are formed of a same material.

8. The image pickup device according to claim 1, wherein a first portion of the incident light is incident on the first pixel and is condensed near the photodetection surface of the photodetection section of the first pixel.

9. The image pickup device according to claim 5, wherein a second portion of the incident light is incident on the second pixel and is condensed at a depth position same as a depth position of the second light shielding section.

10. The image pickup device according to claim 1, wherein the organic film is formed of one of a polyimide resin, an acrylic resin, a styrene resin, and an epoxy resin.

11. The image pickup device according to claim 1, wherein the first pixel and the second pixel each include a fixed charge film between the photodetection section and the light condensing section.

12. The image pickup device according to claim 11, wherein
   the first pixel and the second pixel include a groove between the first pixel and the second pixel adjacent to each other, and
   the fixed charge film is provided along wall surfaces and a bottom surface of the groove.

13. The image pickup device according to claim 12, wherein the groove is filled with an insulating material.

14. The image pickup device according to claim 12, wherein the groove is filled with an insulating material and one of the first light shielding section, a second light shielding section, and a third light shielding section.

15. The image pickup device according to claim 1, wherein
   the light condensing section includes a color filter of red, green, blue, or white, and
   the light condensing section of the second pixel includes a color filter of green or white.

16. The image pickup device according to claim 1, wherein an inner lens is provided on the step part.

17. The image pickup device according to claim 16, wherein the inner lens is an inner lens having an upward convex structure or a downward convex structure, or a rectangular inner lens.

18. An image pickup device comprising:
   a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, wherein at least a part of a wall surface of the step part is covered with a first light shielding section, and wherein the first pixel and the second pixel each include a fixed charge film between the photodetection section and the light condensing section.

19. The image pickup device according to claim 18, wherein the light condensing section includes a lens as an optical functional layer, and the lens of the light condensing section of the first pixel has a shape same as the lens of the light condensing section of the second pixel.

20. The image pickup device according to claim 19, wherein the lens of the light condensing section of the first pixel is opposed to the photodetection section of the first pixel, and the lens of the light condensing section of the second pixel is opposed to the photodetection section of the second pixel.

21. The image pickup device according to claim 18, wherein the wall surface of the step part is perpendicular.

22. The image pickup device according to claim 18, wherein the second pixel includes a second light shielding section that shields a part of the photodetection surface, between the photodetection section and the light condensing section.

23. The image pickup device according to claim 22, wherein the first pixel and the second pixel includes a third light shielding section between the first pixel and the second pixel adjacent to each other.

24. The image pickup device according to claim 23, wherein the first light shielding section, the second light shielding section, and the third light shielding section are formed of a same material.

25. The image pickup device according to claim 18, wherein a first portion of the incident light is incident on the first pixel and is condensed near the photodetection surface of the photodetection section of the first pixel.

26. The image pickup device according to claim 18, wherein a second portion of the incident light is incident on the second pixel and is condensed at a depth position same as a depth position of the second light shielding section.

27. The image pickup device according to claim 18, wherein the step part is filled with an organic film.

28. The image pickup device according to claim 27, wherein the organic film is formed of one of a polyimide resin, an acrylic resin, a styrene resin, and an epoxy resin.

29. The image pickup device according to claim 18, wherein the first pixel and the second pixel include a groove between the first pixel and the second pixel adjacent to each other, and the fixed charge film is provided along wall surfaces and a bottom surface of the groove.

30. The image pickup device according to claim 29, wherein the groove is filled with an insulating material.

31. The image pickup device according to claim 29, wherein the groove is filled with an insulating material and one of the first light shielding section, a second light shielding section, and a third light shielding section.

32. The image pickup device according to claim 18, wherein the light condensing section includes a color filter of red, green, blue, or white, and the light condensing section of the second pixel includes a color filter of green or white.

33. The image pickup device according to claim 18, wherein an inner lens is provided on the step part.

34. The image pickup device according to claim 33, wherein the inner lens is an inner lens having an upward convex structure or a downward convex structure, or a rectangular inner lens.

35. An image pickup device comprising:

a first pixel and a second pixel each including a photodetection section and a light condensing section, the photodetection section including a photoelectric conversion element, the light condensing section condensing incident light toward the photodetection section, the first pixel and the second pixel being adjacent to each other and each having a step part on a photodetection surface of the photodetection section, wherein at least a part of a wall surface of the step part is covered with a first light shielding section, wherein an inner lens is provided on the step part.

36. The image pickup device according to claim 35, wherein the light condensing section includes a lens as an optical functional layer, and the lens of the light condensing section of the first pixel has a shape same as the lens of the light condensing section of the second pixel.

37. The image pickup device according to claim 35, wherein the wall surface of the step part is perpendicular.

38. The image pickup device according to claim 35, wherein the second pixel includes a second light shielding section that shields a part of the photodetection surface, between the photodetection section and the light condensing section.

39. The image pickup device according to claim 35, wherein a first portion of the incident light is incident on the first pixel and is condensed near the photodetection surface of the photodetection section of the first pixel.

40. The image pickup device according to claim 35, wherein the step part is filled with an organic film.

41. The image pickup device according to claim 35, wherein the first pixel and the second pixel each include a fixed charge film between the photodetection section and the light condensing section.

42. The image pickup device according to claim 35, wherein the light condensing section includes a color filter of red, green, blue, or white, and the light condensing section of the second pixel includes a color filter of green or white.

43. The image pickup device according to claim 35, wherein the inner lens is an inner lens having an upward convex structure or a downward convex structure, or a rectangular inner lens.

* * * * *